(12) United States Patent
Hatakeyama et al.

(10) Patent No.: US 9,568,821 B2
(45) Date of Patent: Feb. 14, 2017

(54) PATTERNING PROCESS

(71) Applicants: Shin-Etsu Chemical Co., Ltd., Tokyo (JP); Samsung Electronics Co., Ltd., Suwon-si, Gyeonggi-do (KR)

(72) Inventors: Jun Hatakeyama, Joetsu (JP); Hyun-Woo Kim, Suwon-si (KR)

(73) Assignees: Samsung Electronics Co., Ltd., Suwon-si (KR); Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 14/622,306

(22) Filed: Feb. 13, 2015

(65) Prior Publication Data

US 2015/0234278 A1 Aug. 20, 2015

(30) Foreign Application Priority Data

Feb. 14, 2014 (JP) ................. 2014-026751

(51) Int. Cl.
 G03F 7/20 (2006.01)
 G03F 7/004 (2006.01)
 G03F 7/095 (2006.01)
 G03F 7/32 (2006.01)

(52) U.S. Cl.
 CPC ........... G03F 7/0046 (2013.01); G03F 7/095 (2013.01); G03F 7/2002 (2013.01); G03F 7/325 (2013.01)

(58) Field of Classification Search
 CPC ........ G03F 7/0046; G03F 7/0048; G03F 7/11; G03F 7/20; G03F 7/2002
 See application file for complete search history.

(56) References Cited

U.S. PATENT DOCUMENTS

| | | | |
|---|---|---|---|
| 7,316,886 | B2 | 1/2008 | Kanda |
| 7,537,880 | B2 | 5/2009 | Harada et al. |
| 7,998,655 | B2 | 8/2011 | Tsubaki |
| 8,071,272 | B2 | 12/2011 | Tsubaki |
| 8,211,618 | B2 | 7/2012 | Hatakeyama et al. |
| 8,617,794 | B2 | 12/2013 | Tsubaki |
| 8,951,712 | B2 * | 2/2015 | Hatakeyama ............ 430/273.1 |
| 2005/0277059 | A1 * | 12/2005 | Kanda ..................... 430/270.1 |
| 2007/0122741 | A1 | 5/2007 | Hatakeyama et al. |
| 2008/0118860 | A1 | 5/2008 | Harada et al. |
| 2010/0155826 | A1 | 6/2010 | Wenxu et al. |
| 2010/0190106 | A1 | 7/2010 | Tsubaki |
| 2010/0285409 | A1 | 11/2010 | Tanaka |
| 2011/0300485 | A1 * | 12/2011 | Tsubaki et al. ............ 430/296 |
| 2012/0021355 | A1 | 1/2012 | Kim et al. |
| 2013/0115559 | A1 | 5/2013 | Bae et al. |
| 2013/0337385 | A1 | 12/2013 | Furukawa et al. |
| 2014/0004467 | A1 | 1/2014 | Hirano et al. |
| 2014/0023971 | A1 | 1/2014 | Masuyama et al. |
| 2014/0045123 | A1 | 2/2014 | Sagehashi et al. |
| 2014/0080068 | A1 | 3/2014 | Tsubaki |
| 2015/0234274 | A1 * | 8/2015 | Hatakeyama et al. |

FOREIGN PATENT DOCUMENTS

| | | |
|---|---|---|
| JP | 09-246173 | 9/1997 |
| JP | 2003-149817 | 5/2003 |
| JP | 2005-352384 | 12/2005 |
| JP | 4425776 B2 | 3/2010 |
| JP | 4590431 B2 | 12/2010 |
| JP | 4771083 B2 | 9/2011 |
| JP | 4858714 B2 | 1/2012 |
| JP | 2013-167825 | 8/2013 |
| JP | 5463963 B2 | 4/2014 |
| KR | 20100071605 A | 6/2010 |
| WO | WO 2008/044741 A1 | 4/2008 |
| WO | WO 2010/110236 A1 | 9/2010 |

OTHER PUBLICATIONS

Kim et al. "CD uniformity improvement for EUV resists process: EUV resolution enhancement layer", *Proc. of SPIE* 7969:796916-1 (2011).

* cited by examiner

*Primary Examiner* — Anca Eoff
(74) *Attorney, Agent, or Firm* — Myers Bigel, P.A.

(57) ABSTRACT

There is provided a patterning process that forms a negative pattern by developing using an organic solvent, using a resist top coat composition that not only reduces the effect from the environment on a resist film and effectively blocks OOB light, but also reduces the film loss of a resist pattern and the bridging between patterns, enhances the sensitivity of the resist film, and suppresses the emission of an outgas from the resist film. The patterning process includes the steps of forming a resist top coat on a photoresist film formed on a substrate, with the resist top coat using as a top base material a polymer having a repeating unit p of styrene having a 1,1,1,3,3,3-hexafluoro-2-propanol group, in which m is 1 or 2, and p is $0 < p \leq 1.0$; performing EUV exposure using an electron beam or having a wavelength of 3 nm to 15 nm; and forming a negative pattern by developing using an organic-solvent-based developer.

7 Claims, No Drawings

PATTERNING PROCESS

CROSS-REFERENCE TO RELATED APPLICATION

This U.S. non-provisional patent application claims priority under 35 U.S.C. §119 to Japanese Patent Application No. 2014-026751, filed on Feb. 14, 2014. The disclosure of which is hereby incorporated herein by reference in its entirety.

TECHNICAL FIELD

The present invention relates to a patterning process, and more particularly to a patterning process using a resist top coat composition used in manufacturing semiconductor devices and the like.

BACKGROUND ART

As large-scale integration (LSI) progresses toward higher integration density and higher processing speed, reduction of pattern rules also progresses rapidly. In the background of this rapid progress of downscaling, projection lenses having a higher numerical aperture (NA) are being developed, resist composition performance is being improved, and light sources are being shifted to shorter wavelengths.

General use of a resist composition for a krypton-fluoride (KrF) examiner laser (248 nm) started in a 0.3-μm process, and this has been applied to mass-production of a 0.13-μm rule. The shift to a shorter wavelength from a KrF excimer laser to an argon-fluoride (ArF) examiner laser (193 nm) makes it possible to reduce the design rule to 0.13 μm or less, but because resins such as a novolak resin or a polyvinyl phenol resin, which have been used in the past, have strong absorption of light that is near 193 nm near 193 nm, they cannot be used as a resist base resin. To secure transparency and sufficient dry-etching resistance, an acryl resin and a cycloolefin-based alicyclic resin were evaluated, and as a result, mass-production of a device using ArF lithography was realized.

In the 45-nm node device, the wavelength of the exposure-light source was shortened, and thus $F_2$ lithography of 157 nm became a candidate for next-generation lithography. However, $F_2$ lithography has many problems, such as: increased cost of scanners due to the introduction of expensive $CaF_2$ single crystals in a projection lens; the need to change the optical system due to the extremely poor durability of soft pellicles, thereby necessitating hard pellicles; and decreased etching resistance of the resist. Thus, postponement of $F_2$ lithography and early introduction of ArF immersion lithography were proposed, and 45-nm node devices using ArF immersion lithography are being produced on a mass scale. For mass-production of 32-nm node devices, a double patterning process using a sidewall spacer is used, but the process is long and complicated, which is a problem.

What is wanted for a device after 32 nm is not an expensive, double-patterning process, but EUV (extreme ultraviolet) lithography of 13.5 nm, the resolution thereof being improved by shifting the exposure light to a wavelength that is shorter by more than one digit than previous lithography technology, and thus development of EUV lithography of 13.5 nm is progressing. In EUV lithography, the power of a laser is weak, and the amount of light decreases according to the attenuation of reflective mirror light, and thus the intensity of light reaching a wafer surface is low. Thus, to acquire throughput with low light intensity, development of a highly sensitive resist is urgently needed. However, if the sensitivity of the resist is enhanced, there is a problem of deterioration of both resolution and edge roughness (LER: line-edge roughness, and LWR: line-width roughness), and thus a trade-off relationship between increased sensitivity and deterioration in resolution and in edge roughness has been pointed out.

The EUV resist has a problem in that because of its high sensitivity it is easily affected by contaminants in the atmosphere around it. An amine quencher usually is added to a chemically amplified resist to ease the effect of amine contamination in air, but the amount of the amine quencher added to the EUV resist is a small fraction of the amount of the amine quencher added to an ArF resist. Accordingly, the EUV resist tends to form a T-top shape by receiving the effect of the amine from the resist's surface. The formation of a top coat on a resist's upperlayer is effective in preventing the effect of contaminants in the surrounding atmosphere. In an early type of a chemically amplified resist for a KrF excimer laser based on a t-BOC (tertiary-butoxycarbonyl)-protected polyhydroxy styrene, to which an amine quencher was not added, the use of a top coat was effective in preventing the effect of contaminants in the surrounding atmosphere. Even in an early stage of ArF immersion lithography, a top coat was used to prevent elution of an acid generator into water, thereby preventing formation of a T-top configuration that would result from such elution. Here, also in the EUV lithography process, to form a top coat on the upper layer of a resist was proposed as described in Non-patent Document 1. By forming a top coat, environmental resistance is improved, and outgas from the resist film is reduced.

An EUV laser of DPP (discharge-produced plasma) and LPP (laser-produced plasma) emits, in addition to 13.5-nm-wavelength light that is used for patterning, a weak broadband light having a wavelength of 140 nm to 300 nm (out-of-band, OOB). The intensity of this broadband light (hereinafter "OOB light") is weak, but the amount of the light's energy cannot be neglected because of its wide wavelength range. A Zr filter is provided to an EUV microstepper to cut the OOB light, but this decreases the light intensity. In an EUV scanner in which, to improve throughput, the light intensity is not allowed to decrease, it is possible to not use this filter. Non-patent Document 1 shows the superiority of forming a top coat to shield the resist's upper layer from the OOB light.

Many kinds of materials have been proposed for use as a resist top coat in ArF immersion lithography. Among the materials proposed, Patent Document 1, discussed below, discloses a top coat composition containing a polymer of a repeating unit of styrene having a 1,1,1,3,3,3-hexafluoro-2-propanol group, which is supposed to be unpractical due to very high absorption of light that is at a wavelength of 193 nm.

Patent Document 2 points out that, in the case of a top coat for immersion lithography: (1) a solvent for a top coat dissolves the surface of the resist film, thereby causing mixing between the top coat and the resist film, and this in turn causes film loss of a resist pattern after the film has been developed; (2) especially, when an alcohol solvent is used, a great amount of film loss occurs; and (3) an ether solvent is effective in inhibiting film loss. An example of a polymer that is soluble in ether solvents is a polymer that has a 1,1,1,3,3,3-hexafluoro-2-propanol (HFA) group, as described in Patent Document 2. However, the fluorine atoms in a polymer strongly absorb EUV light, and thus if a HFA-containing polymer is used as the top coat of a resist's upper layer, the sensitivity of the resist is lowered after patterning, which is a problem.

Non-patent Document 1 reports that (1) in the case of a positive-type resist film, when an entire wafer is exposed, the width of the lines in the peripheral region of a shot becomes narrower due to OOB light leaked from neighboring shots; and (2) if a top coat that absorbs light having a wavelength of 200 nm to 300 nm is applied on a resist film, the variation of the pattern size within a shot can be reduced. Patent Document 3 proposes a top coat of a hydroxylstyrene or a cresol-novolak resin applied as a solution of alcoholic solvents such as 4-methyl-2-pentanol, 2-methyl-2-pentanol, or isopropyl alcohol, 3,3,5-trimethyl-1-hexanol.

Patent Document 4 provides a method that (1) uses a resist for ArF immersion lithography, based on a polymethacrylate substituted by an acid labile group to form a positive pattern by developing with alkaline, and (2) forms a negative pattern by developing by using an organic solvent. That document also shows that using a protective film for developing with an organic solvent reduces the amount of substances eluted in the immersion liquid and improves water-droplet sliding properties.

Patent Document 4 also discloses a method of forming a negative pattern by developing with an organic solvent under EUV exposure. In ArF exposure, arranging a dot-pattern mask to form a hole pattern with a negative resist has an advantage in that it is possible to use high-contrast light. However EUV light, which has a wavelength shorter than that of ArF light by one digit or more, is not advantageous in the contrast in arranging the dot-pattern mask. Nonetheless, EUV exposure is advantageous only in that the resist sensitivity thereof can be enhanced because the number of photons under EUV exposure is larger than under ArF exposure.

PATENT DOCUMENTS

Patent Document 1: Japan Unexamined Patent Application Publication No. 2005-352384
Patent Document 2: Japan Patent No. 4771083
Patent Document 3: United States Patent Application Publication No. 2012/0021355
Patent Document 4: Japan Patent No. 4590431

Non-Patent Document

Non-patent Document 1: Proc. SPIE Vol. 7969, p. 796916-1 (2011).

SUMMARY OF THE INVENTION

Technical Problems to be Overcome by the Objectives of the Invention

The present invention, which was made in view of the problems in the patterning process described above, has the objective of providing a patterning process that forms (1) a negative pattern by developing using an organic solvent, and (2) a resist top coat composition that not only reduces the effect of contaminants in the surrounding atmosphere on a resist film and effectively shields against OOB light, but also reduces the resist pattern's film loss and bridging between patterns, enhances the sensitivity of the resist film, and suppresses the emission of outgas from the resist film.

Solution to the Problems

The patterning process of the present invention includes (a) forming a resist top coat on a photoresist film formed on a substrate, with the resist top coat using, as a top base material, a polymer having a repeating unit p of styrene having a 1,1,1,3,3,3-hexafluoro-2-propanol group shown in the following general formula (1), wherein m is 1 or 2, and p is $0<p\leq1.0$; (b) performing EUV exposure using an electron beam or EUV exposure having a wavelength of 3 nm to 15 nm; and (c) forming a negative pattern by developing using an organic-solvent-based developer.

Chemical formula 1

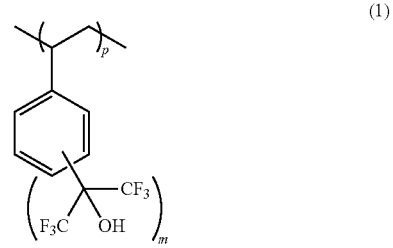

(1)

It is preferable that the resist top coat contains a polymer compound made by copolymerizing the repeating unit p of styrene having a 1,1,1,3,3,3-hexafluoro-2-propanol group shown in the following general formula (2), with one or more repeating units selected from the repeating units q1-q4, wherein $R^1$ is hydrogen, methyl; $X_1$ is a single bond, —C(=O)—O—, —O—, —N=; $X_2$ and $X_3$ are phenylene, naphthylene; $X_4$ is methylene, oxygen, sulfur; $R^2$ is C6-C20 allyl, C2-C6 alkenyl; $R^3$, $R^4$, $R^5$, and $R^6$ are independently hydrogen, hydroxyl, linear, branched, or cyclic C1-C10-alkyl, C2-C6-alkenyl, C6-C10-allyl, alkoxy, acyloxy, cyano, nitro, amino, halogen; the allyl may be substituted by hydroxyl, linear, branched, or cyclic C1-C10-alkyl, alkoxy, acyloxy, cyano, nitro, amino, halogen; v is 1 or 2; and $0<p\leq1.0$, $0\leq q1<1.0$, $0\leq q2<1.0$, $0\leq q3<1.0$, $0\leq q4<1.0$, and $0\leq q1+q2+q3+q4<1.0$.

Chemical formula 2

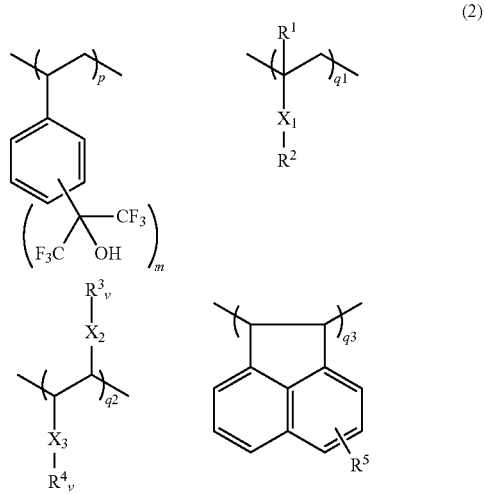

(2)

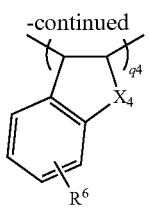

It is preferable that the composition of the resist top coat be soluble in an organic-solvent-based developer, and that the organic-solvent-based developer be one or more solvents selected from the group consisting of 2-octanone, 2-nonanone, 2-heptanone, 3-heptanone, 4-heptanone, 2-hexanone, 3-hexanone, diisobutyl-ketone, methylcyclohexanone, acetophenone, methylacetophenone, propyl-acetate, butyl-acetate, isobutyl-acetate, amyl-acetate, butenyl-acetate, isoamyl-acetate, phenyl-acetate, propyl-formate, butyl-formate, isobutyl-formate, amyl-formate, isoamyl-formate, methyl-valerate, methyl-pentenate, methyl-crotonate, ethyl-crotonate, methyl-propionate, ethyl-propionate, 3-ethoxyethyl-propionate, methyl-lactate, ethyl-lactate, propyl-lactate, butyl-lactate, isobutyl-lactate, amyl-lactate, isoamyl-lactate, 2-hydroxymethyl-isobutyrate, ethyl-2-hydroxy-isobutyrate, methyl-benzoate, ethyl-benzoate, phenyl-acetate, benzyl-acetate, phenylmethyl-acetate, benzyl-formate, phenylethyl-formate, methyl-3-phenylpropionate, benzyl-propionate, ethyl-phenyl-acetate, and 2-phenylethyl-acetate.

It is preferable that (1) the resist top coat composition used in the patterning process contains (a) an ether solvent selected from the group consisting of diisopropyl ether, diisobutyl ether, diisopentyl ether, di-n-pentyl ether, methylcyclopentyl ether, methyl cyclohexyl ether, di-n-butyl ether, di-sec-butyl ether, diisopentyl-ether, di-sec-pentyl ether, di-tert-amyl ether, and di-n-hexyl ether, wherein the polymer having a repeating unit p of styrene has a 1,1,1,3,3,3-hexafluoro-2-propanol group that dissolves in any of the ether solvents; and (b) a C7-C12 hydrocarbon compound solvent in addition to the ether solvent; and (2) the boiling point of the C7-C12 hydrocarbon compound at 1 atm be in the range of 85° C.-250° C.

It is preferable that (1) the C7-C12 hydrocarbon compound be one or more hydrocarbon-based solvents selected from the group consisting of n-heptane, isoheptane, 3-methyl hexane, 2,3-dimethyl pentane, 3-ethyl-pentane, 1,6-heptadiene, 5-methyl-1-hexyne, norbornane, norbornene, dicyclopentadiene, 1-methyl-1,4-cyclohexadiene, 1-heptyne, 2-heptyne, cycloheptane, cycloheptene, 1,3-dimethyl-cyclopentane, ethylcyclopentane, methylcyclohexane, 1-methyl-1-cyclohexene, 3-methyl-1-cyclohexene, methylenecyclohexane, 4-methyl-1-cyclohexene, 2-methyl-1-hexene, 2-methyl-2-hexene, 1-Heptene, 2-Heptene, 3-Heptene, n-octane, 2,2-dimethyl-hexane, 2,3-dimethyl-hexane, 2,4-dimethyl-hexane, 2,5-dimethyl-hexane, 3,3-dimethyl-hexane, 3,4-dimethyl-hexane, 3-ethyl-2-methyl-pentane, 3-ethyl-3-methyl-pentane, 2-methyl-heptane, 3-methyl-heptane, 4-methyl-heptane, 2,2,3-trimethyl-pentane, 2,2,4-trimethyl-pentane, cyclooctane, cyclooctene, 1,2-dimethyl-cyclohexane, 1,3-dimethyl-cyclohexane, 1,4-dimethyl-cyclohexane, ethyl-cyclohexane, vinyl-cyclohexane, isopropyl-cyclopentane, 2,2-dimethyl-3-hexene, 2,4-dimethyl-1-hexene, 2,5-dimethyl-1-hexene, 2,5-dimethyl-2-hexene, 3,3-dimethyl-1-hexene, 3,4-dimethyl-1-hexene, 4,4-dimethyl-1-hexene, 2-Ethyl-1-hexene, 2-methyl-1-heptene, 1-octene, 2-octene, 3-octene, 4-octene, 1,7-octadiene, 1-octyne, 2-octyne, 3-octyne, 4-octyne, n-nonane, 2,3-dimethyl-heptane, 2,4-dimethyl-heptane, 2,5-dimethyl-heptane, 3,3-dimethyl-heptane, 3,4-dimethyl-heptane, 3,5-dimethyl-heptane, 4-ethyl-heptane, 2-methyl-octane, 3-methyl-octane, 4-methyl-octane, 2,2,4,4-tetramethylpentane, 2,2,4-trimethyl-hexane, 2,2,5-trimethyl-hexane, 2,2-dimethyl-3-heptene, 2,3-dimethyl-3-heptene, 2,4-dimethyl-1-heptene, 2,6-dimethyl-1-heptene, 2,6-dimethyl-3-heptene, 3,5-dimethyl-3-heptene, 2,4,4-Trimethyl-1-hexene, 3,5,5-Trimethyl-1-hexene, 1-ethyl-2-methyl-cyclohexane, 1-ethyl-3-methyl-cyclohexane, 1-ethyl-4-methyl-cyclohexane, propyl-cyclohexane, isopropyl-cyclohexane, 1,1,3-trimethyl-cyclohexane, 1,1,4-trimethyl-cyclohexane, 1,2,3-trimethyl-cyclohexane, 1,2,4-trimethyl-cyclohexane, 1,3,5-trimethyl-cyclohexane, allyl-cyclohexane, hydrindane, 1,8-nonadiene, 1-nonyne, 2-nonyne, 3-nonyne, 4-nonyne, 1-nonene, 2-nonene, 3-nonene, 4-nonene, n-decane, 3,3-dimethyl-octane, 3,5-dimethyl-octane, 4,4-dimethyl-octane, 3-ethyl-3-methyl-heptane, 2-Methylnonane, 3-methylnonane, 4-methylnonane, tert-butyl-cyclohexane, butylcyclohexane, iso-butyl-cyclohexane, 4-isopropyl-1-methyl-cyclohexane, pentylcyclopentane, 1,1,3,5-tetramethyl cyclohexane, cyclododecane, 1-decene, 2-decene, 3-decene, 4-decene, 5-decene, 1,9-decadiene, decahydro-naphthalene, 1-decyne, 2-decyne, 3-decyne, 4-decyne, 5-decyne, 1,5,9-decatriene, 2,6-dimethyl-2,4,6-octatriene, limonene, myrcene, 1,2,3,4,5-Pentamethylcyclopentadiene, α-phellandrene, pinene, terpinene, tetrahydrodicyclopentadiene, 5,6-dihydro-cyclopentadiene, dicyclopentadiene, 1,4-decadiyne, 1,5-decadiyne, 1,9-decadiyne, 2,8-decadiyne, 4,6-decadiyne, n-undecane, amyl cyclohexane, 1-undecene, 1,10-undecadien, 1-undecyne, 3-undecyne, 5-undecyne, Tricyclo[6.2.1.0$^{2,7}$]undec-4-ene, n-dodecane, 2-methyl-undecane, 3-methyl-undecane, 4-methyl-undecane, 5-methyl-undecane, 2,2,4,6,6-penta-methyl-heptane, 1,3-dimethyl-adamantane, 1-ethyl-adamantane, 1,5,9-cyclododecatriene, toluene, xylene, cumene, 1,2,3-trimethyl-benzene, 1,2,4-trimethyl-benzene, 1,3,5-trimethyl-benzene, styrene, α-methyl styrene, butyl-benzene, sec-butyl-benzene, isobutyl-benzene, cymene, diethyl-benzene, 2-ethyl-p-xylene, 2-propyl toluene, 3-propyl-toluene, 4-propyl-toluene, 1,2,3,5-tetramethyl toluene, 1,2,4,5-tetramethyl toluene, tetrahydronaphthalene, 4-Phenyl-1-butene, tert-amyl benzene, amyl benzene, 2-tert-butyl-toluene, 3-tert-butyl-toluene, 4-tert-butyl-toluene, 5-isopropyl-m-xylene, neopentyl benzene, 3-methyl-ethylbenzene, tert-butyl-3-ethylbenzene, 4-tert-butyl-o-xylene, 5-tert-Butyl-m-xylene, tert-butyl-p-xylene, 1,2-diisopropyl-benzene, 1,3-diisopropyl-benzene, 1,4-diisopropyl-benzene, di-propyl-benzene, 3,9-dodecadiyne, pentamethylbenzene, hexamethylbenzene, hexyl-benzene, 1,3,5-triethyl-benzene, and 1,2,4-trivinyl-cyclohexane; (2) the step of forming a negative pattern by developing using an organic-solvent-based developer comprises simultaneously developing the photoresist film and removing the resist top coat.

Advantageous Effects of the Invention

According to the patterning process of the present invention, by using the resist top coat composition of the present invention, film loss of the resist pattern due to amine contamination in the air can be avoided, and resist film sensitivity can be enhanced due to the sensitization effect of the resist top coat composition on the resist film. At the same time, generation of outgas from the resist film by exposure in a vacuum can be suppressed. The resist top coat composition of the present invention is highly soluble in an organic solvent, and thus the top coat can be removed and the resist film developed simultaneously. In addition, the top coat composition of the present invention does not dissolve the resist film nor form a mixing layer, and thus there is no change in the resist form after developing. Further, OOB light that has a wavelength of 140 nm to 300 nm and that is generated from an EUV laser or the like is absorbed, so that the photoresist can be protected from being sensitized. Moreover, the top coat composition is dissolved into an ether solvent or a hydrocarbon-based solvent that does not dissolve the resist layer, so that the composition does little damage to the resist layer and doesn't form a mixing layer between the top coat and the resist layer, thereby reducing film loss of the resist pattern after developing.

DESCRIPTION OF THE EMBODIMENT

Examples of implementing the patterning process of the present invention will now be described in detail, referring to chemical formulas.

The inventors of the present invention extensively investigated how to accomplish the objective mentioned above, and as a result found that the formation of a resist top coat as mentioned below was effective (1) in reducing the effect of contaminants in the surrounding atmosphere on the resist film, (2) in absorbing OOB light, and (3) in reducing (a) film loss of the resist pattern, and (b) bridging between patterns. Because this resist top coat is soluble in an organic-solvent-based developer, it can be removed simultaneously when the resist film is being developed, and because its patterning process is simple, it minimizes the increase in the processing cost.

It is generally said that, at a 13.5-nm wavelength, hydrogen atoms, carbon atoms, silicon atoms, and sulfur atoms have low absorption of light, while oxygen atoms and fluorine atoms absorb much light at 13.5 nm. A fluorinated polymer has high absorption at a 13.5-nm wavelength. If a resist top coat absorbs any light at all at a 13.5-nm wavelength, the sensitivity of the resist film decreases. In EUV lithography having low laser power, the lowered sensitivity of the resist film is a problem. Accordingly, the resist top coat needs to be highly transparent. In addition, the fluorinated polymer, which is not soluble in an organic-solvent-based developer, requires a separate cup that is dedicated exclusively for removal of the resist top coat before developing, thereby resulting in a cumbersome process. A resist top coat that can be removed simultaneously when the resist film is being developed is desirable, and thus a material having a group that makes a polymer solubilized into an organic solvent is necessary in designing the resist top coat composition. The resist top coat that is mentioned below satisfies such requirements.

An alkyl group, a fluorinated alkyl group, a hexafluoroalcohol group, and so forth can be mentioned as groups that make a polymer increase the solubility into the organic-solvent-based developer. But in regard to transparency, because a hexafluoroalcohol group has six fluorine atoms, it absorbs much light. However, a polymer having a hexafluoroalcohol group is advantageous because of its good solubility in ether solvents that do little damage to a resist film.

It is generally said that a resist based on a polyhydroxy styrene is highly efficient in generating an acid by exposure to EUV. Sensitivity is enhanced due to exposure to EUV, which causes a transfer of energy from a phenol group to an acid generator. Accordingly, to enhance the resist's sensitivity, a resist based on a polyhydroxy styrene has been investigated.

A resist having an acid generator (PAG) bound to a polymer main chain has been proposed. In particular, if an acid generator of a sulfonium salt or an iodonium salt having a sulfonic acid bound to a polymer main chain is used, unsharpness of the resist pattern due to acid diffusion can be suppressed by shortening of the acid-diffusion distance, and thus this is advantageous in fine patterning (Patent Document 10). Two drawbacks of a resist having a bound PAG are its low sensitivity and the low resolution of the space between fine patterns that are located side by side due to the low solubility of the resist in the organic-solvent-based developer. Development of a resist that is highly sensitive and low in pattern film loss after developing is desired.

The resist top coat composition according to one embodiment of the present invention contains, as a top base material, a polymer having a repeating unit of styrene having a 1,1,1,3,3,3-hexafluoro-2-propanol group shown in the general formula (1).

Chemical formula 1

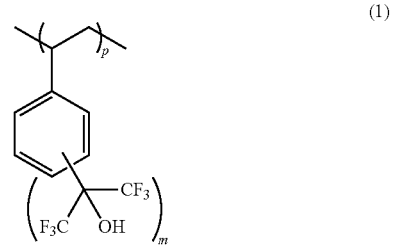

(1)

(In the general formula, m is 1 or 2; and p is $0<p\leq1.0$.)

A polymer having a repeating unit of styrene having a 1,1,1,3,3,3-hexafluoro-2-propanol group is highly soluble in an ether solvent. Shown below is the monomer to obtain a repeating unit p.

Chemical formula 4

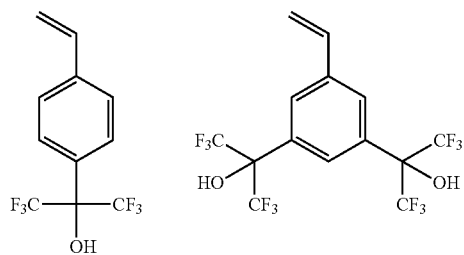

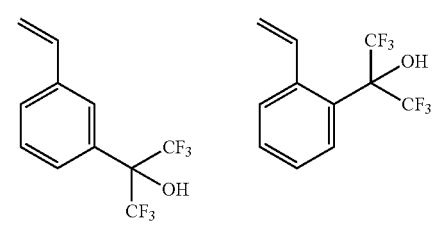

-continued

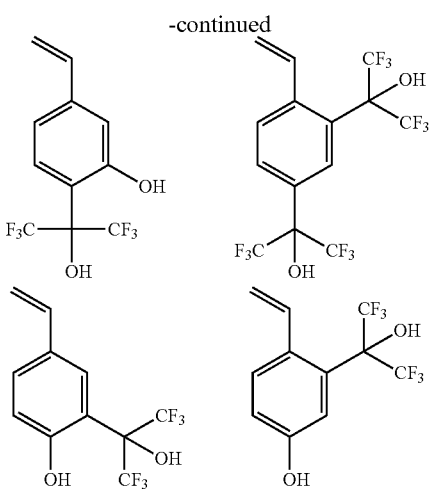

The repeating unit p of styrene having a 1,1,1,3,3,3-hexafluoro-2-propanol group can be copolymerized with another hydrocarbon-based repeating unit to reduce the fluorine content, which is advantageous for increasing transparency to EUV light, suppressing the outgoing of gas from resist film, and increasing the effect of blocking OOB light. Also, by copolymerizing with a repeating unit having a phenolic hydroxy group, the polymer obtained can generate secondary electrons when exposed to EUV light, which is advantageous for increasing the resist's sensitivity due to diffusion of the secondary electrons within the resist film. The repeating unit copolymerized with the repeating unit p is shown as q1-q4 in the following general formula (2).

Chemical formula 5

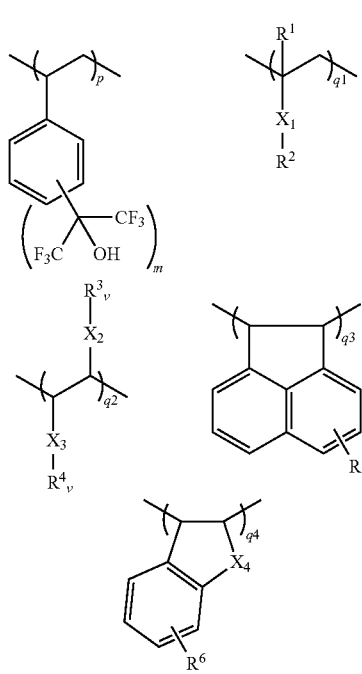

(2)

(In the general formula, $R^1$ is hydrogen, methyl; $X_1$ is a single bond, —C(=O)—O—, —O—, —N=; $X_2$ and $X_3$ are phenylene, naphthylene; $X_4$ is methylene, oxygen, sulfur; $R^2$ is C6-C20-allyl, C2-C6-alkenyl; $R^3$, $R^4$, $R^5$, and $R^6$ are independently hydrogen, hydroxyl, linear, branched, or cyclic C1-C10-alkyl, C2-C6-alkenyl, C6-C10-allyl, alkoxy, acyloxy, cyano, nitro, amino, halogen; the allyl may be substituted by hydroxyl, linear, branched, or cyclic C1-C10-alkyl, alkoxy, acyloxy, cyano, nitro, amino, halogen; v is 1 or 2; and $0<p\leq1.0$, $0\leq q1<1.0$, $0\leq q2<1.0$, $0\leq q3<1.0$, $0\leq q4<1.0$, and $0\leq q1+q2+q3+q4<1.0$.)

A specific example of the monomer to obtain the repeating unit q1 includes the following.

Chemical formula 6

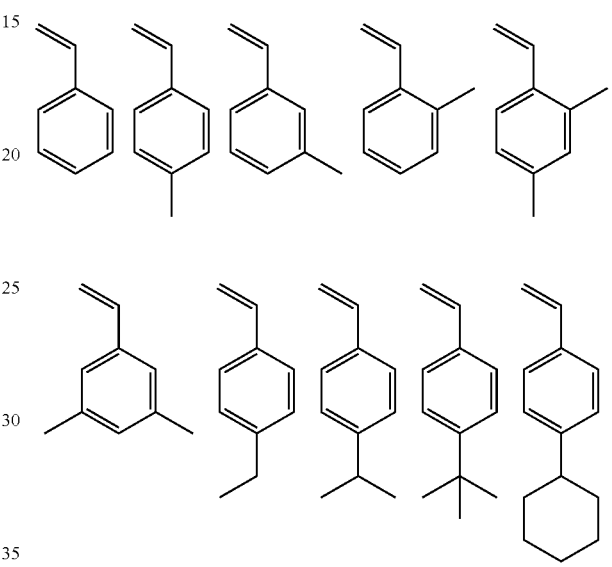

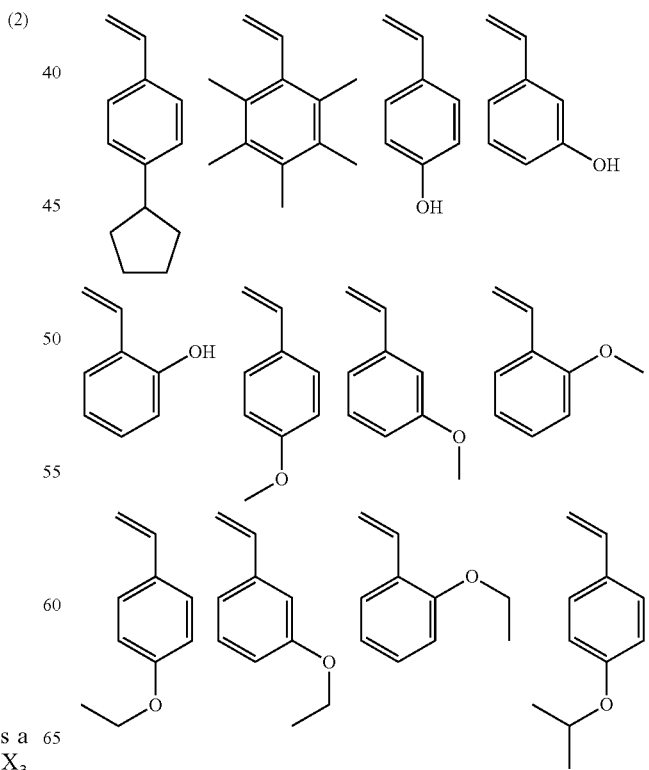

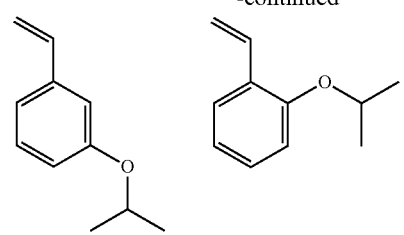
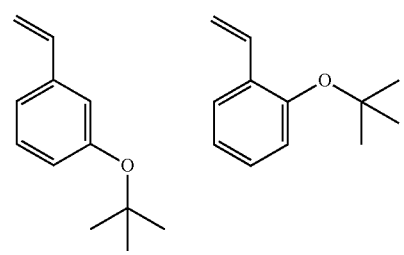
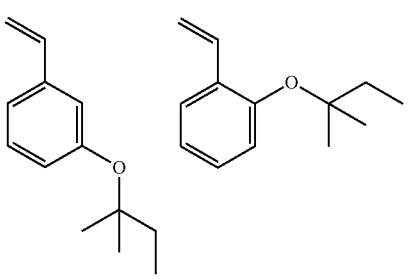
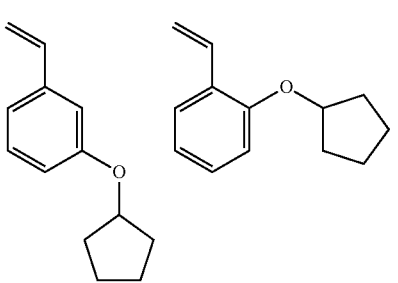
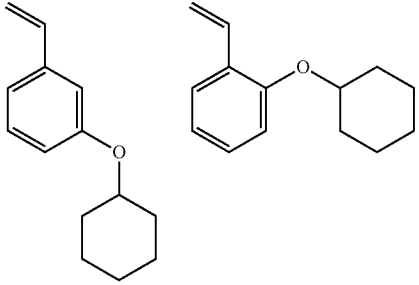
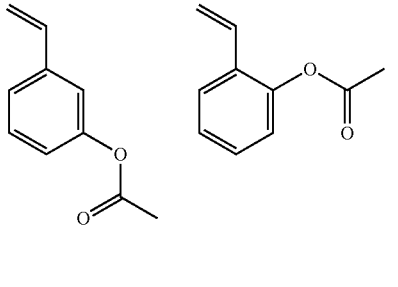
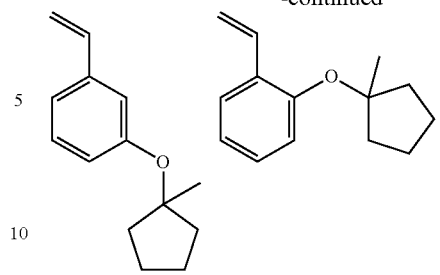
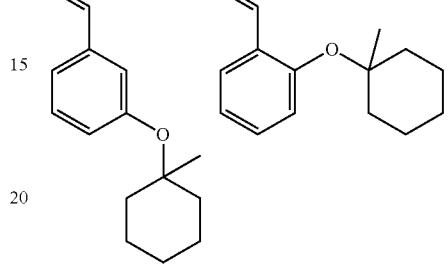
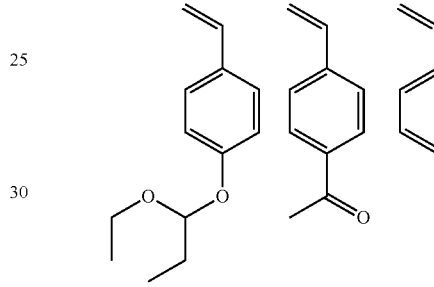
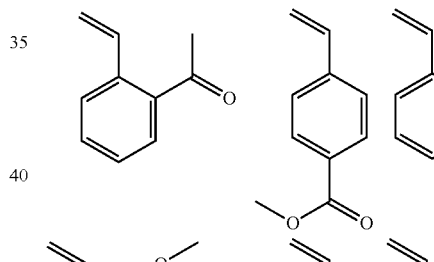
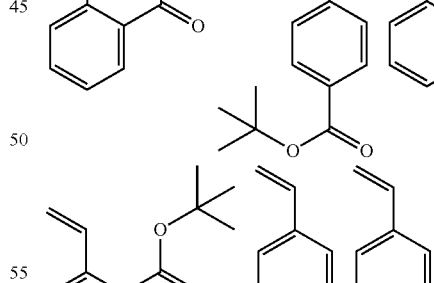
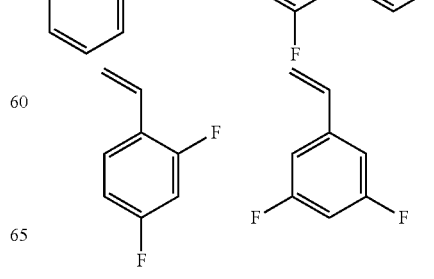

-continued
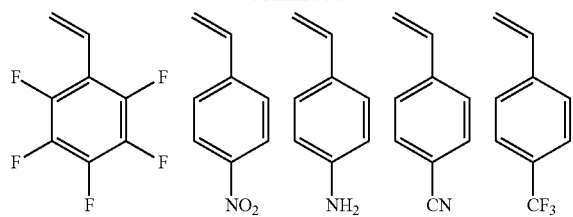
Chemical formula 7
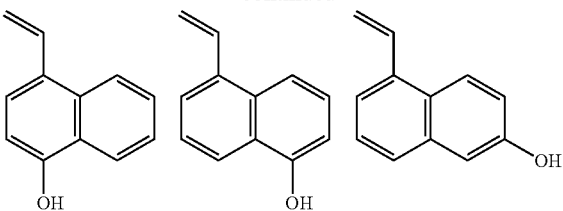

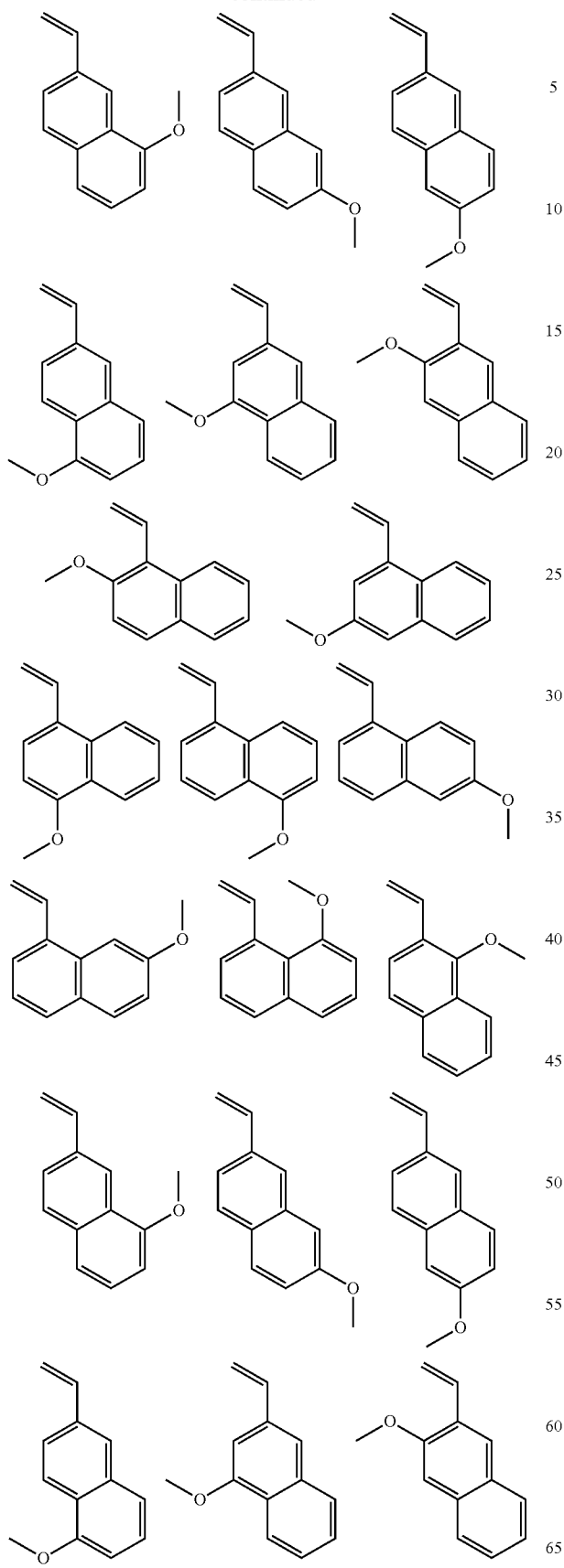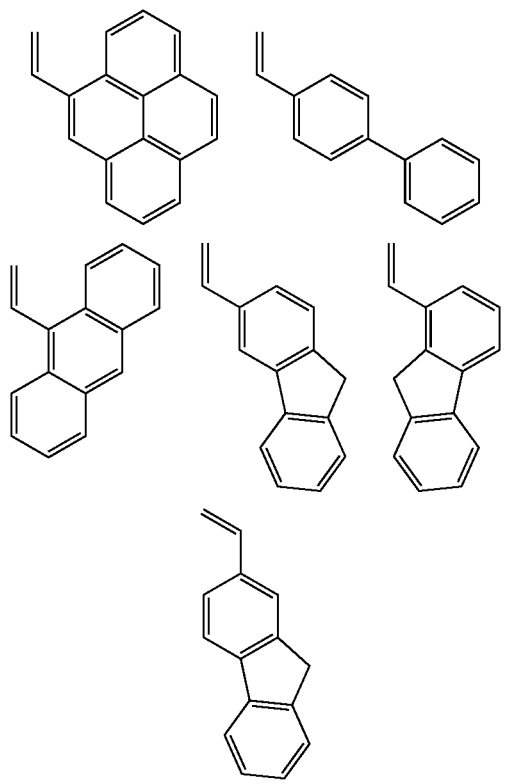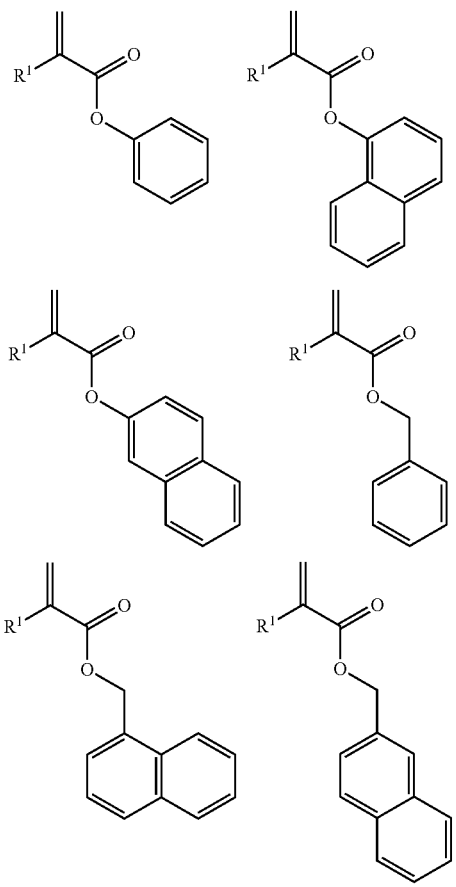
Chemical formula 8

17
-continued
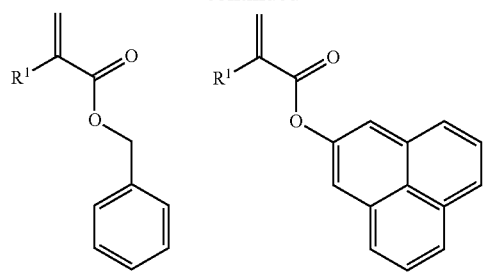
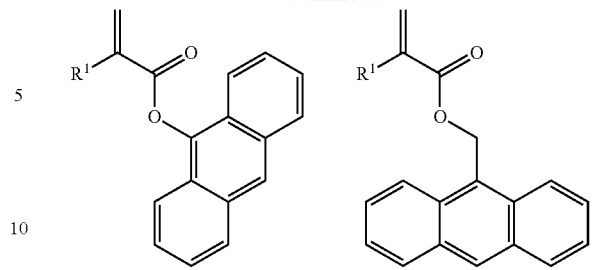
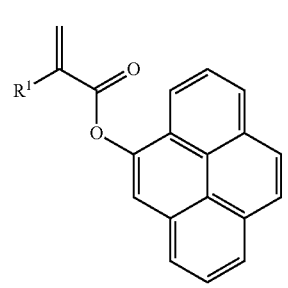
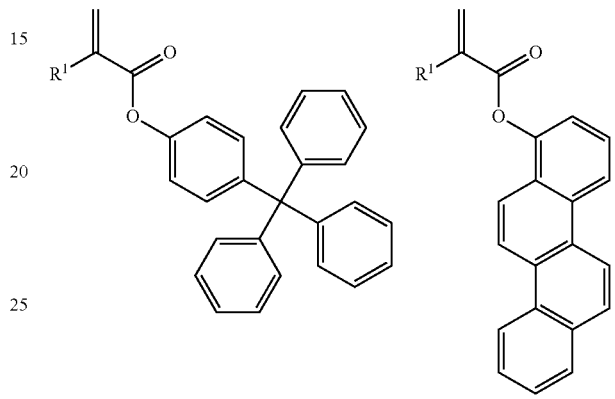
18
-continued
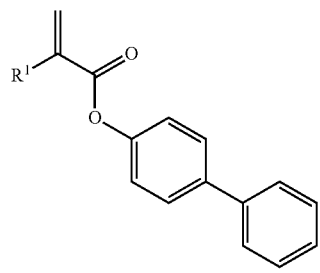
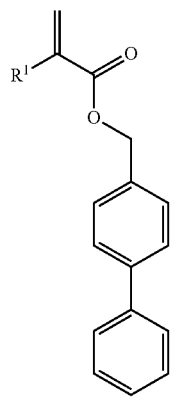
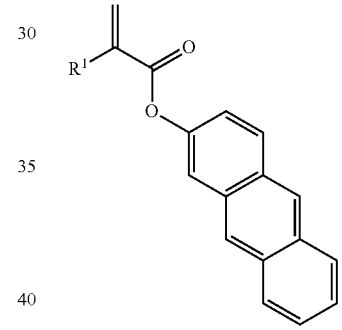
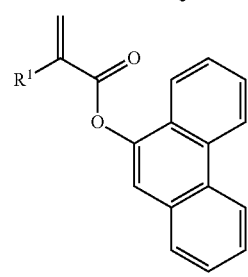
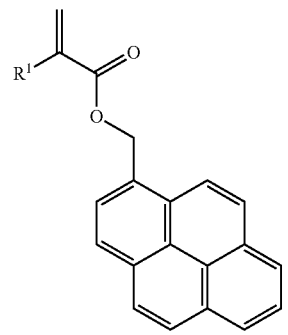
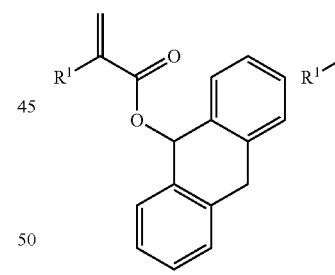
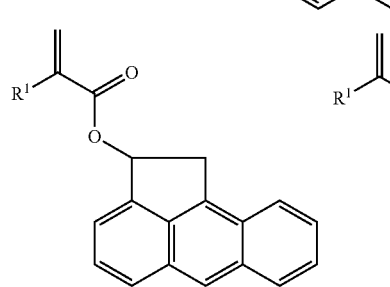
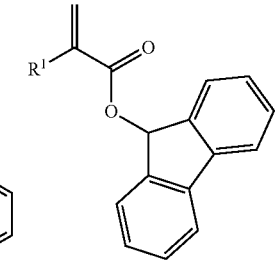

-continued
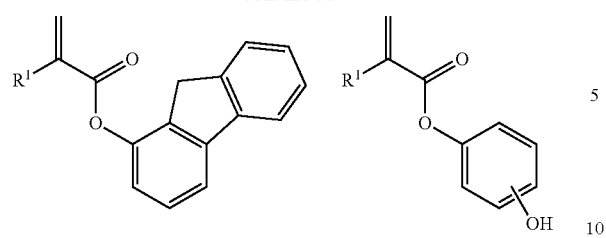
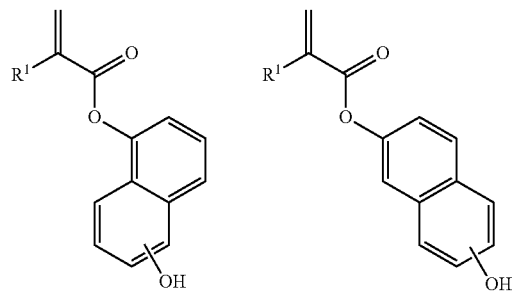
Chemical formula 9
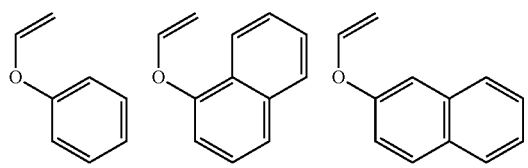
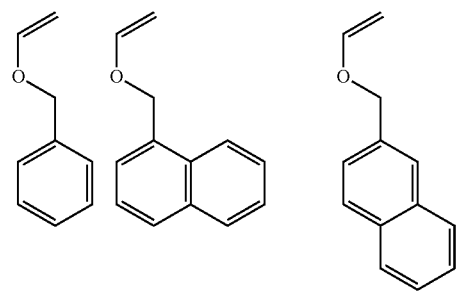
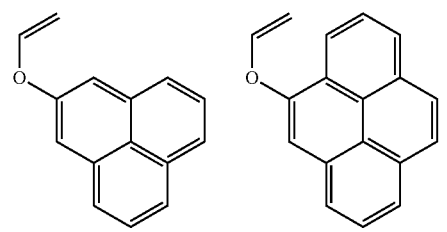
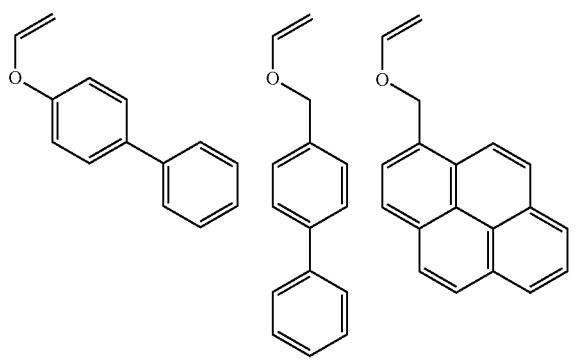
-continued
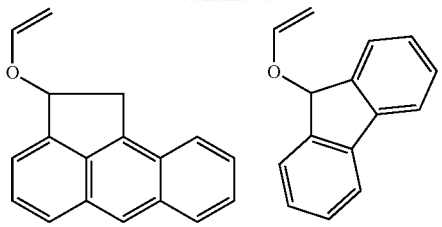
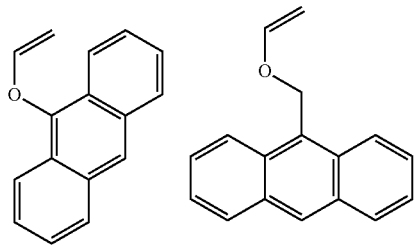
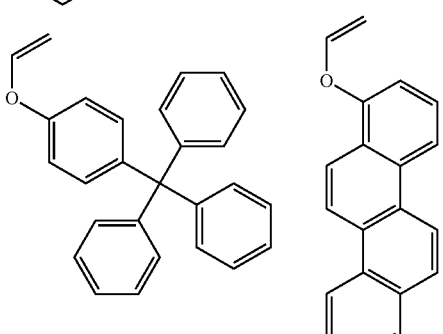
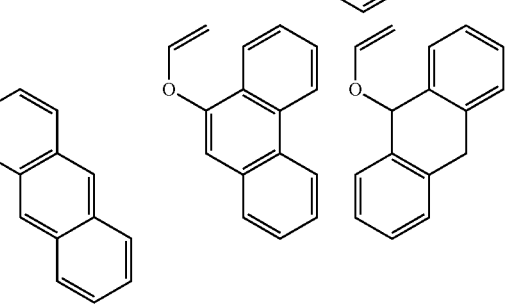
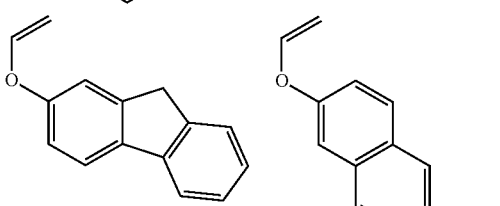
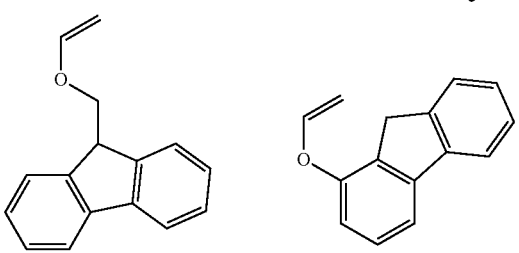

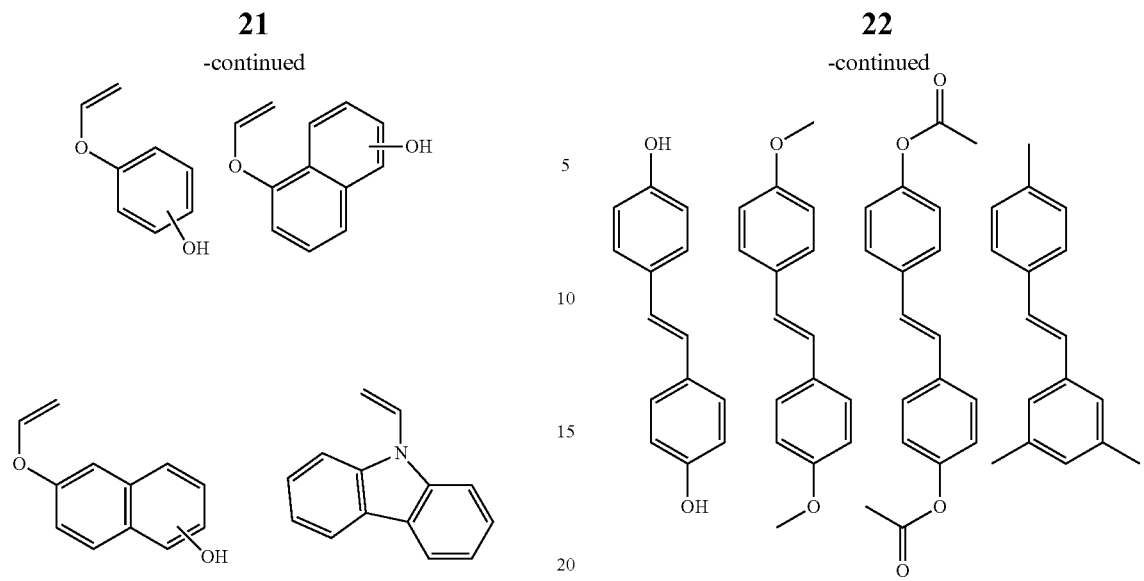
A specific example of the monomer to obtain the repeating unit q2 includes the following.
Chemical formula 10
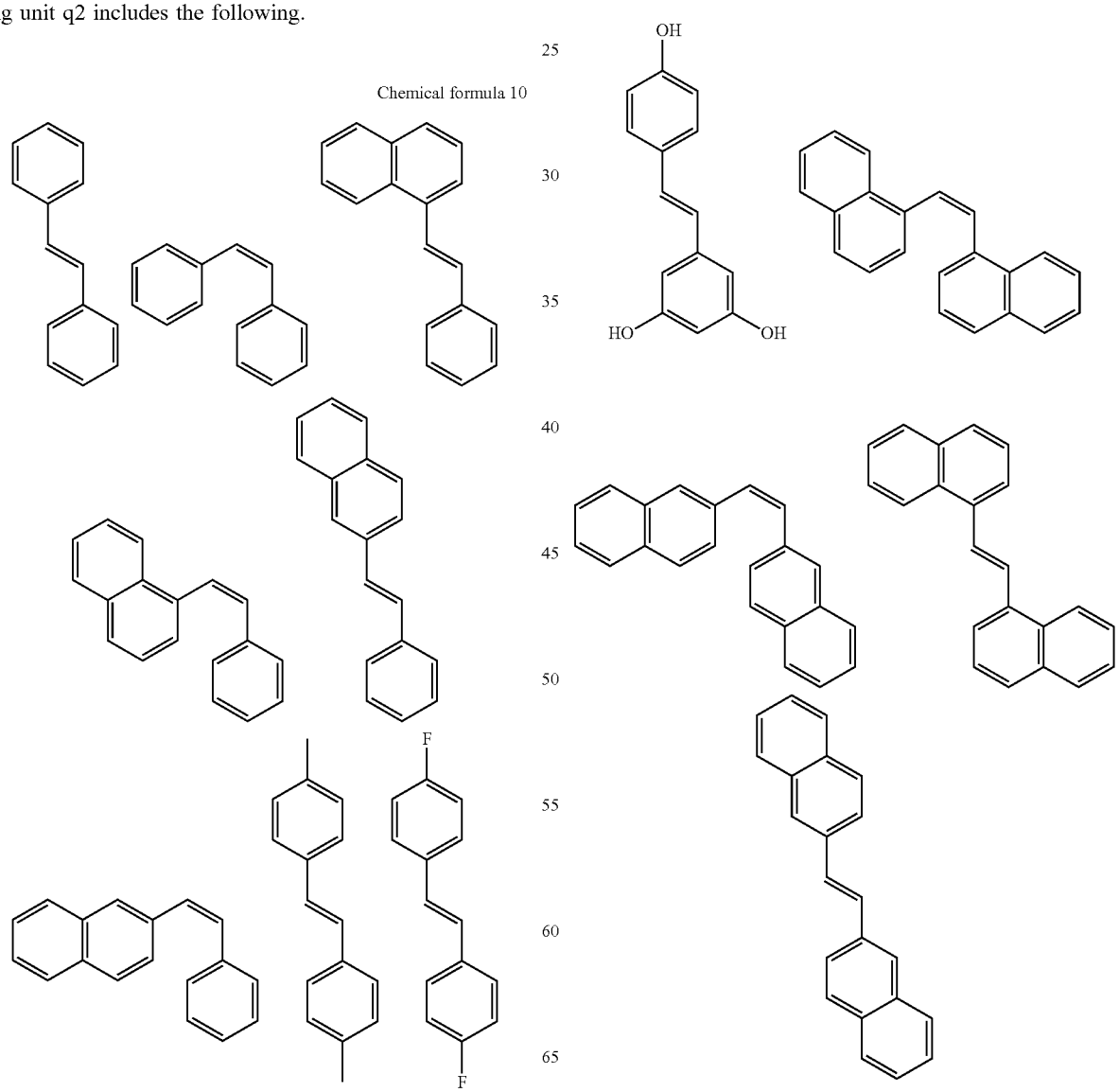

A specific example of the monomer to obtain the repeating unit q3 includes the following.
Chemical formula 11
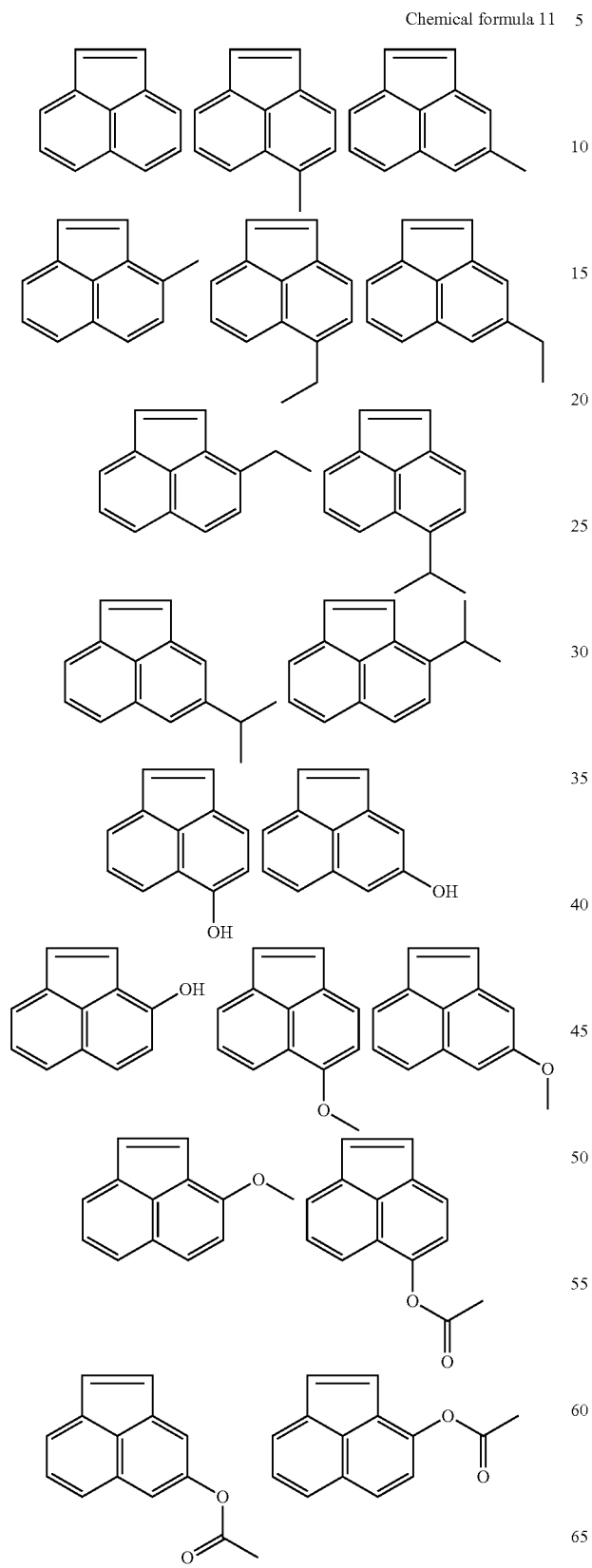
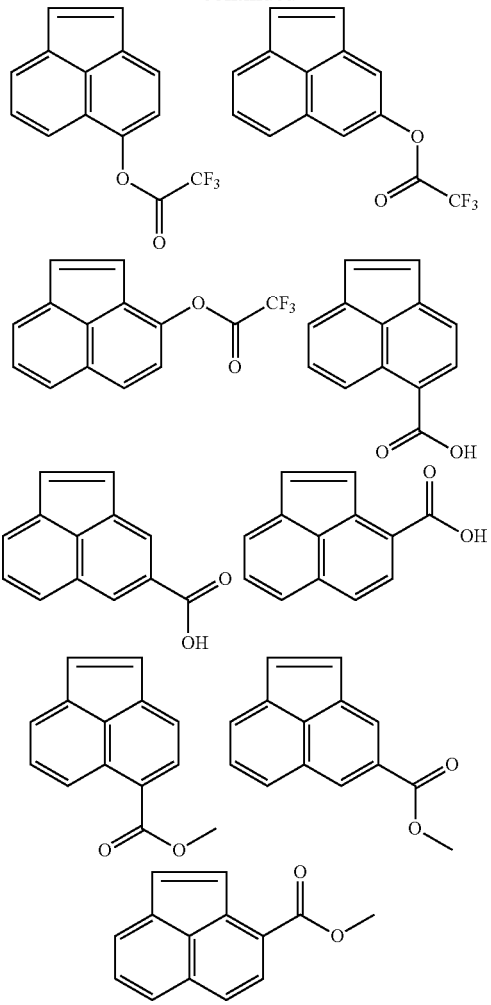
A specific example of the monomer to obtain the repeating unit q4 includes the following.
Chemical formula 12
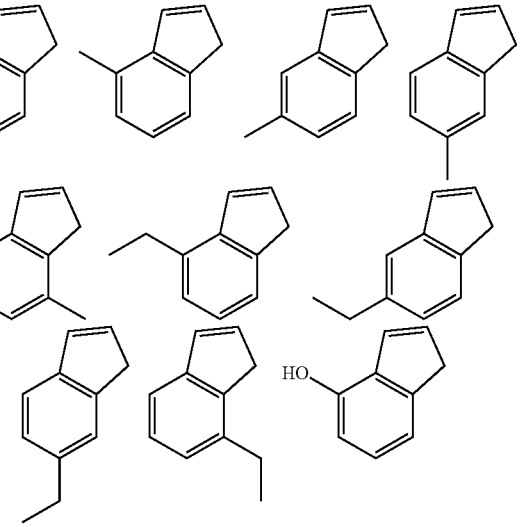

25
-continued
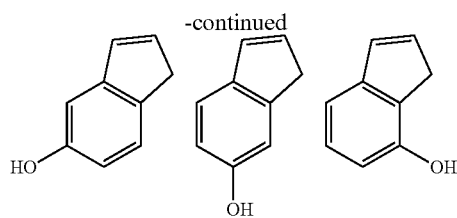
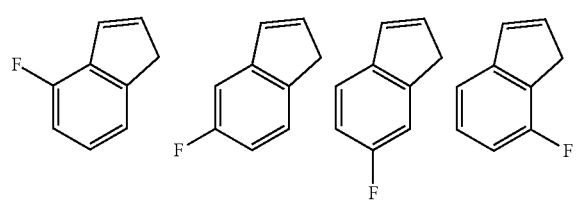
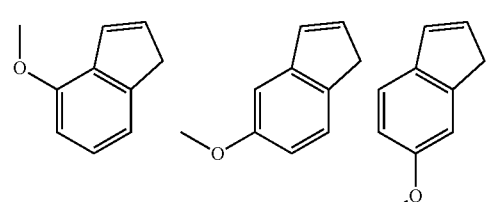
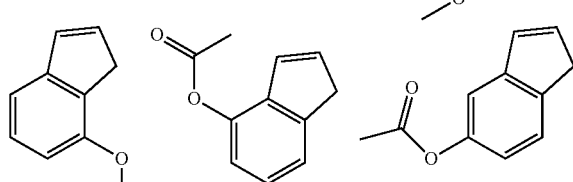
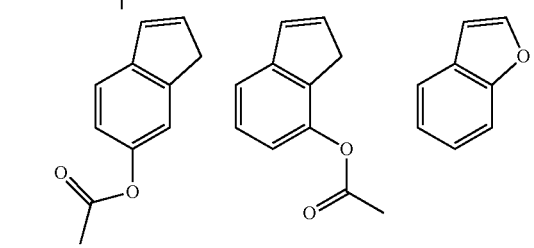
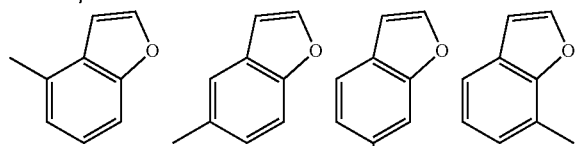
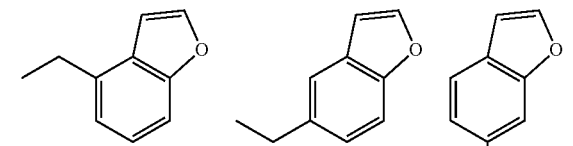
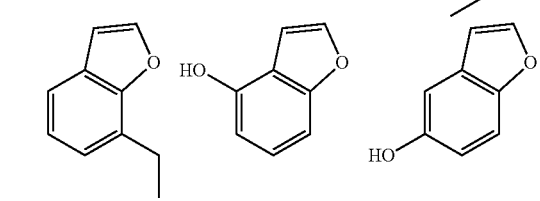
26
-continued
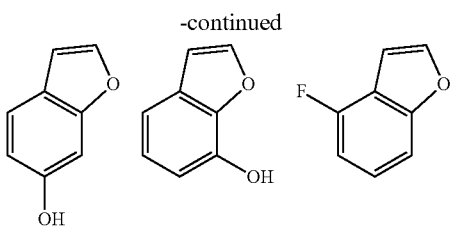
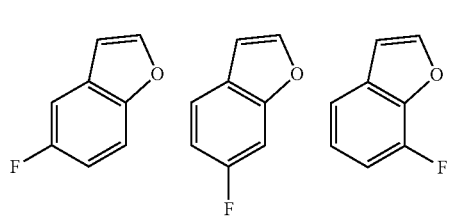
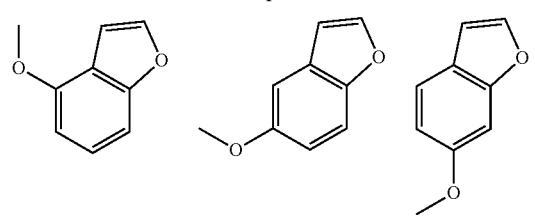
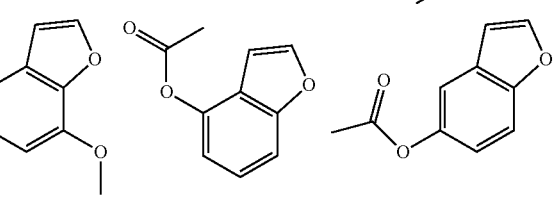
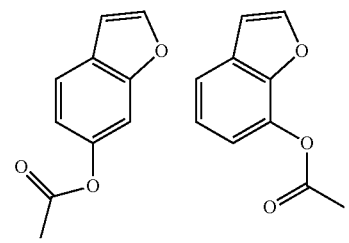
Chemical formula 13
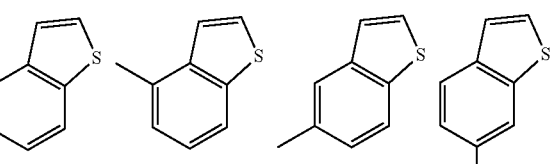
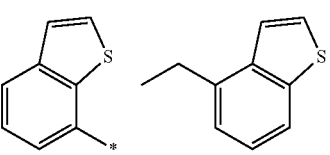
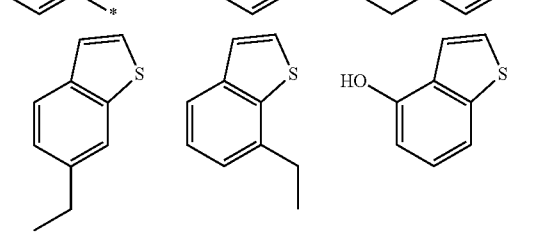

-continued

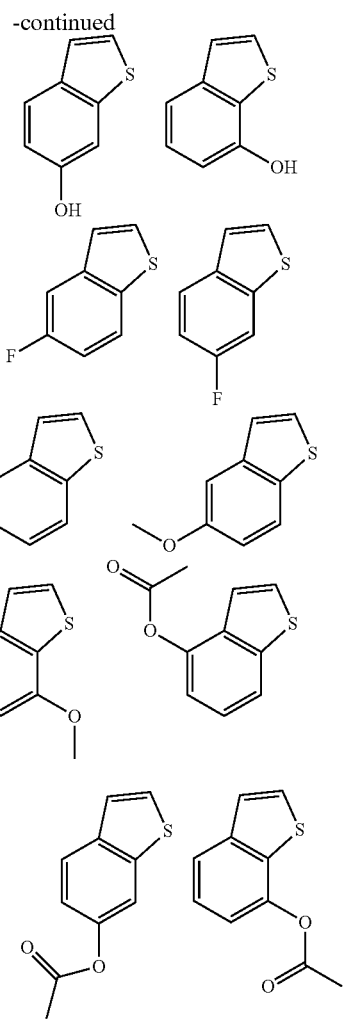

The composition of the present invention essentially comprises a polymer composed of a repeating unit p of styrene having a 1,1,1,3,3,3-hexafluoro-2-propanol group, which is alkaline soluble, and further contains, as an essential component, a polymer containing a segment of a repeating unit p of styrene having a 1,1,1,3,3,3-hexafluoro-2-propanol group, which is alkaline soluble. In order to suppress outgas from the resist film during the exposure to EUV light, the polymer of this invention has a segment of a repeating unit p and at least one segment selected from a repeating unit q1, q2, q3, and q4 copolymerized. Examples of the repeating unit q1 are styrene, vinyl-naphthalene, vinyl-carbazole, methacrylate with an aromatic group, vinyl ether; examples of the repeating unit q2 are stilbenes, styryl-naphthalenes, dinaphthyl-ethylenes; examples of the repeating unit q3 are acenaphthylenes, indenes, benzofurans; and examples of the repeating unit q4 are benzothiophenes. Among the repeating units of q1, q2, q3, and q4, acenaphthylene, which is most effective in suppressing the generation of an outgas and in suppressing OOB light, is preferably used as a component of the polymer.

The repeating unit p of styrene having a 1,1,1,3,3,3-hexafluoro-2-propanol group and the repeating units of q1-q4 are in the range of $0.1 \leq p < 1.0$, $0 \leq q1 < 1.0$, $0 \leq q2 < 1.0$, $0 \leq q3 < 1.0$, $0 \leq q4 < 1.0$; preferably $0.2 \leq p \leq 1.0$, $0 \leq q1 \leq 0.7$, $0 \leq q2 \leq 0.7$, $0 \leq q3 \leq 0.7$, $0 \leq q4 \leq 0.7$. Regarding the molecular weight of the polymer containing the repeating unit p of styrene having a 1,1,1,3,3,3-hexafluoro-2-propanol group, the average molecular weight (Mw) is preferably in the range of 1,000-50,000. If the molecular weight exceeds 50,000, the solubility of the polymer in the solvent and the alkaline developer might decrease. If Mw does not exceed 1,000, film loss of the resist pattern after developing might increase due to a part of the resist film being solubilized into the polymer.

The polymerization of the polymer for the resist top coat according to this embodiment of the present invention is usually initiated by a radical polymerization initiator such as AIBN (azobisisobutyronitrile) or by an ion derived from a catalyst such as alkyllithium (anionic polymerization). The polymerization can be carried out in accordance with processes known in the art. Examples of a radical polymerization initiator include the following, although not limited thereto: azo-compounds, including 2,2'-Azobis(4-methoxy-2,4-dimethylvaleronitrile), 2,2'-Azobis(2,4-dimethylvaleronitrile), and 2,2'-azobisisobutyronitrile, 2,2'-Azobis(2,4,4-trimethylpentane); peroxides compound, including tert-butyl peroxypivalate, lauroyl peroxide, Benzoyl peroxide, and tert-butyl peroxy laurate; water-soluble persulfates, including potassium persulfate; and redox initiators, such as a combination of peroxides and reducing agents, including a combination of hydrogen peroxide and sodium sulfite. Although the amount of the polymerization initiator used is appropriately changeable according to the type of initiator, polymerization-reaction condition, and the like, an initiator's usual percentage of the whole monomer used is 0.001% to 5.000% by weight, and preferably 0.01% to 2.00% by mass.

Also, the polymerization reaction can be carried out in the presence of a polymerization solvent. The polymerization solvent should be selected from those that do not inhibit the polymerization reaction. Typical examples of polymerization solvents are: esters including ethyl acetate, and n-butyl acetate; ketones, including acetone, methyl ethyl ketone, and methyl isobutyl ketone; aliphatic or aromatic hydrocarbons, including toluene, xylene, and cyclohexane; alcohols, including isopropyl alcohol, and ethylene glycol monomethyl ether; ether-type solvents, including diethyl ether, dioxan, tetrahydrofuran, di-n-butyl ether, di-n-amyl ether, and diisoamyl ether. These solvents can be used singly or by mixing two or more solvents. Also, a known molecular-weight modifier such as dodexyl mercaptan can simultaneously be used.

The temperature of the polymerization reaction depends on the type of the polymerization initiator and on the boiling point of the solvent, which usually is in the range of 20° C. to 200° C., preferably in the range of 50° C. to 140° C. The reactor vessel used for such polymerization reactions is not especially limited. The removal of the organic solvent or water from the polymer solution or from the polymer dispersion according to this embodiment of the present invention is usually carried out by any method known in the art. Examples of such methods are filtering after reprecipitation and distillation under reduced pressure.

The solvent used for the resist top coat composition should be one that does not dissolve the photoresist film but that does dissolve an alkali-soluble polymer that has a repeating unit p of styrene having a 1,1,1,3,3,3-hexafluoro-2-propanol group. The solvent that dissolves the alkali-soluble polymer that has a repeating unit of styrene having a 1,1,1,3,3,3-hexafluoro-2-propanol group is typically a C6-C10 ether solvent, and is preferably selected from the group of diisopropyl-ether, diisobutyl-ether, diisopentyl-ether, di-n-pentyl-ether, methyl cyclopentyl-ether, methylcyclohexyl-ether, di-n-butyl-ether, di-sec-butyl-ether, di-sec-pentyl-ether, di-tert-amyl-ether, and di-n-hexyl-ether, and mixtures thereof.

A solvent that does not dissolve a photoresist film is typically a C7-C12 hydrocarbon-based solvent having a boiling point of 85° C.-250° C. at 1 atm (1013 hPa), and is preferably selected from the group of n-heptane, isoheptane, 3-methyl hexane, 2,3-dimethyl pentane, 3-ethyl-pentane, 1,6-Heptadiene, 5-methyl-1-hexyne, norbornane, norbornene, dicyclopentadiene, 1-methyl-1,4-cyclohexadiene, 1-heptyne, 2-heptyne, cycloheptane, cycloheptene, 1,3-dimethyl-cyclopentane, ethylcyclopentane, methylcyclohexane, 1-methyl-1-cyclohexene, 3-methyl-1-cyclohexene, methylenecyclohexane, 4-methyl-1-Cyclohexene, 2-methyl-1-hexene, 2-methyl-2-hexene, 1-Heptene, 2-Heptene, 3-Heptene, n-octane, 2,2-dimethyl hexane, 2,3-dimethyl hexane, 2,4-dimethyl hexane, 2,5-dimethyl hexane, 3,3-dimethyl hexane, 3,4-dimethyl hexane, 3-ethyl-2-methylpentane, 3-ethyl-3-methyl pentane, 2-methyl heptane, 3-methyl heptane, 4-methyl heptane, 2,2,3-trimethyl pentane, 2,2,4-trimethyl pentane, cyclooctane, cyclooctene, 1,2-dimethyl cyclohexane, 1,3-dimethyl cyclohexane, 1,4-dimethyl cyclohexane, ethyl cyclohexane, vinyl cyclohexane, isopropylcyclopentane, 2,2-dimethyl-3-hexene, 2,4-Dimethyl-1-hexene, 2,5-Dimethyl-1-hexene, 2,5-Dimethyl-2-hexene, 3,3-Dimethyl-1-hexene, 3,4-Dimethyl-1-hexene, 4,4-Dimethyl-1-hexene, 2-Ethyl-1-hexene, 2-Methyl-1-heptene, 1-octene, 2-octene, 3-octene, 4-octene, 1,7-Octadiene, 1-Octyne, 2-Octyne, 3-Octyne, 4-Octyne, n-nonane, 2,3-dimethyl-heptane, 2,4-dimethyl-heptane, 2,5-dimethyl-heptane, 3,3-dimethyl-heptane, 3,4-dimethyl-heptane, 3,5-dimethyl-heptane, 4-ethyl-heptane, 2-methyl-octane, 3-methyl-octane, 4-methyl-octane, 2,2,4,4-tetramethylpentane, 2,2,4-trimethyl hexane, 2,2,5-trimethyl hexane, 2,2-Dimethyl-3-heptene, 2,3-Dimethyl-3-heptene, 2,4-Dimethyl-1-heptene, 2,6-Dimethyl-1-heptene, 2,6-Dimethyl-3-heptene, 3,5-Dimethyl-3-heptene, 2,4,4-Trimethyl-1-hexene, 3,5,5-Trimethyl-1-hexene, 1-ethyl-2-methyl-cyclohexane, 1-ethyl-3-methyl-cyclohexane, 1-ethyl-4-methyl-cyclohexane, propyl cyclohexane, isopropyl cyclohexane, 1,1,3-trimethyl-cyclohexane, 1,1,4-trimethyl-cyclohexane, 1,2,3-trimethyl-cyclohexane, 1,2,4-trimethyl-cyclohexane, 1,3,5-trimethyl-cyclohexane, allyl cyclohexane, hydrindane, 1,8-Nonadiene, 1-Nonyne, 2-Nonyne, 3-Nonyne, 4-Nonyne, 1-Nonene, 2-Nonene, 3-Nonene, 4-Nonene, n-Decane, 3,3-dimethyl-octane, 3,5-dimethyl-octane, 4,4-dimethyl-octane, 3-ethyl-3-methyl heptane, 2-Methylnonane, 3-Methylnonane, 4-Methylnonane, tert-butyl-cyclohexane, butylcyclohexane, iso-butyl cyclohexane, 4-isopropyl-1-methyl-cyclohexane, pentylcyclopentane, 1,1,3,5-tetramethyl cyclohexane, cyclo dodecane, 1-Decene, 2-Decene, 3-Decene, 4-Decene, 5-Decene, 1,9-Decadiene, decahydronaphthalene, 1-Decyne, 2-Decyne, 3-Decyne, 4-Decyne, 5-Decyne, 1,5,9-Decatriene, 2,6-Dimethyl-2,4,6-octatriene, Limonene, Myrcene, 1,2,3,4,5-Pentamethylcyclopentadiene, α-Phellandrene, pinene, Terpinene, tetrahydrodicyclopentadiene, 5,6-dihydro-cyclopentadiene, Dicyclopentadiene, 1,4-Decadiyne, 1,5-Decadiyne, 1,9-Decadiyne, 2,8-Decadiyne, 4,6-Decadiyne, n-Undecane, amyl cyclohexane, 1-Undecene, 1,10-Undecadien, 1-Undecyne, 3-Undecyne, 5-Undecyne, Tricyclo[6.2.1.0$^{2,7}$]undec-4-ene, n-dodecane, 2-methyl-undecane, 3-methyl-undecane, 4-methyl-undecane, 5-methyl undecane, 2,2,4,6,6-penta-methyl-heptane, 1,3-Dimethyl-adamantane, 1-ethyl-adamantane, 1,5,9-Cyclododecatriene, toluene, xylene, cumene, 1,2,3-Trimethylbenzene, 1,2,4-Trimethylbenzene, 1,3,5-Trimethylbenzene, styrene, α-methyl styrene, butyl benzene, sec-butyl-benzene, isobutyl benzene, cymene, diethyl-benzene, 2-ethyl-p-xylene, 2-propyl toluene, 3-propyl toluene, 4-propyl toluene, 1,2,3,5-tetramethyl toluene, 1,2,4,5-tetramethyl toluene, tetrahydronaphthalene, 4-Phenyl-1-butene, Tert-amyl benzene, amyl benzene, 2-tert-butyl-toluene, 3-tert-butyl-toluene, 4-tert-butyl-toluene, 5-isopropyl-m-xylene, neopentyl benzene, 3-methyl-ethylbenzene, tert-Butyl-3-ethylbenzene, 4-tert-Butyl-o-xylene, 5-tert-Butyl-m-xylene, tert-Butyl-p-xylene, 1,2-diisopropyl-benzene, 1,3-diisopropyl-benzene, 1,4-diisopropyl-benzene, di-propyl benzene, 3,9-Dodecadiyne, pentamethylbenzene, hexamethylbenzene, hexyl benzene, 1,3,5-triethylbenzene, and 1,2,4-Trivinylcyclohexane and mixtures thereof. The hydrocarbon-based solvent is preferably 30% or more by mass, more preferably 40% or more by mass, or even-more preferably 50% or more by mass, relative to the total combined mass of the C6-C10 ether solvent and the C7-C12 hydrocarbon-based solvent.

The resist top coat composition used in the patterning process according to this embodiment of the present invention may contain an acid generator, and may contain, for example, a compound (photo acid generator) that can generate an acid in response to an active beam or to a radiation beam. Any compound that can generate an acid by being exposed to a high-energy beam as described above can be used as the acid generator. Examples of a preferable acid generator are sulfonium salts, iodonium salts, N-sulfonyl oxyimides, or oxime-O-sulfonates. These may be used singly or as a mixture of two or more of them, as will be explained later. Specific examples of the acid generator are described in Paragraphs [0122] to [0142] of Japanese Unexamined Patent Application Publication No. 2008-111103. By adding the acid generator to the top coat composition, the bridging defect between resist patterns after developing is reduced.

The resist top coat composition used in the patterning process according to this embodiment of the present invention may further contain an amine quencher. Typical examples of an amine quencher are described in Paragraphs of [0146] to [0164] of Japanese Unexamined Patent Application Publication No. 2008-111103. By adding an amine quencher, the rectangularity of the resist pattern after developing is improved. By concurrent use of the acid generator and the amine quencher, the LWR of the resist pattern is reduced.

Surfactants may be added to the top coat composition according to this embodiment of the present invention. The surfactants are described in Paragraphs [0165] to [0166] of Japanese Unexamined Patent Application Publication No. 2008-111103.

The amount of the surfactant added to the resist top coat composition is preferably 0.0001 part to 10 parts by mass, especially 0.001 part to 5.000 parts by mass, relative to 100 parts by mass of the top coat base composition.

The photoresist used in the patterning process according to this embodiment of the present invention is a chemically amplified positive resist or negative resist, and the positive resist needs to have, for example, a repeating unit e in which an acid labile group is bonded to the carboxyl group, and/or a repeating unit f in which an acid labile group is bonded to the hydroxyl group, which is/are represented by formula (7), described in Paragraph 0041 of Patent Document 6. Moreover, edge (LWR) roughness is reduced by allowing the photoresist to have a repeating unit in which an acid generating group is bonded to the main chain as described in Paragraph 0038 of that publication.

Each weight-average molecular weight Mw of the polymer in the resist composition is in the range of 1,000 to 500,000, preferably in the range of 2,000 to 30,000. By using a polymer whose molecular weight is 1,000 or more, the resist composition obtained has good heat resistance, and by using a polymer whose molecular weight is 500,000 or less, the resist composition obtained has good alkaline-solubility and does not cause any footing-profile phenomenon after patterning.

In the multicomponent copolymer used in the resist composition, a molecular-weight distribution (Mw/Mn) that is too wide sometimes precipitates a foreign matter on a pattern after exposure, or damages the pattern profile after exposure, due to the existence of both a low-molecular-weight component and a high-molecular-weight component in the copolymer. Therefore, in accordance with progress of miniaturization in the pattern rules, the effects of the molecular weight and the molecular-weight distribution as mentioned above tend to be larger. Thus, to obtain a resist composition that can be suitably used in a fine pattern size, the molecular-weight distribution of a multicomponent copolymer to be used is preferably in the range of 1.0-2.0, especially in the narrow-dispersion range of 1.0-1.5.

The patterning process using the resist top coat composition according to this embodiment of the present invention will now be explained. This patterning process includes at least the following steps: (1) forming a photoresist film on a substrate; (2) using the resist top coat composition of the present invention to form a resist top coat on the photoresist film; (3) exposing the resist top coat; and (4) developing using a developer.

First, a photoresist film is formed on a substrate. An example of a photoresist material is one that contains a copolymer based on a polymethacrylate substituted by an acid labile group and an acid generator. This film may be formed, for example, by a spin coating method. At this time, to reduce the amount of the photoresist film composition being dispensed during spin coating, it is preferable that the photoresist film composition be dispensed by spin coating when the substrate is being wetted by a solvent for the photoresist or by a solution mixed with the solvent for the photoresist (see, for example, Japanese Unexamined Patent Application Publication No. H9-246173). This dispensing by spin coating has an advantage that the photoresist film composition solution can be well spread on the substrate so as to reduce the amount of the photoresist film composition being dispensed.

The film thickness of the resist film is preferably in the range of 5 nm to 500 nm, more preferably 10 nm to 300 nm. One example of a resist composition is one in which is polymerized a methacrylate ester having a cyclic acid labile group, which is described in Japanese Unexamined Patent Application Publication No. 2003-149817, and whose part of the carboxyl group of methacrylate is substituted by an acid labile group. Another example is a composition in which a polymerizable acid generator is polymerized, which is described in Japanese Unexamined Patent Application Publication No. 2006-178317.

Then a resist top coat is formed on the photoresist film by using the resist top coat composition of the present invention. This resist top coat may be formed, for example, by a spin coating method. In spin coating of the resist top coat composition, the same process for the photoresist film as mentioned above can be used, and thus the resist top coat composition can be applied after the surface of the photoresist film is wetted by a solvent but before the resist top coat composition is applied. The film thickness of the resist top coat thus formed is preferably in the range of 2 nm to 200 nm, more preferably 5 nm to 50 nm. To wet the surface of the photoresist film by a solvent, a rotation coating method or a vapor prime method may be used, though a rotation coating method is preferable. Regarding the solvent used during this process, it is preferable that there be used (1) an ether solvent in which the photoresist film does not dissolve, or (2) a mixed solvent consisting of the ether solvent and a hydrocarbon-based solvent.

The dissolution rate of the resist top coat in the organic-solvent-based developer according to this embodiment of the present invention is preferably 3 nm/second or faster, more preferably 5 nm/second or faster.

The resist top coat, after being formed on the resist film, is exposed to a light in the range of 3 nm to 15 nm (EUV) or to an electron beam (EB) in a vacuum and then is baked (PEB: post-exposure bake) as necessary. Developing is performed, for example, in the organic-solvent-based developer for 3 seconds to 300 seconds. Examples of an organic-solvent-based developer are: 2-octanone, 2-nonanone, 2-heptanone, 3-heptanone, 4-heptanone, 2-hexanone, 3-hexanone, diisobutyl-ketone, methylcyclohexanone, acetophenone, methylacetophenone, propyl-acetate, butyl-acetate, isobutyl-acetate, amyl-acetate, butenyl-acetate, iso-amyl-acetate, phenyl-acetate, propyl-formate, butyl-formate, isobutyl-formate, amyl-formate, isoamyl-formate, methyl-valerate, methyl-pentenate, methyl-crotonate, ethyl-crotonate, methyl-propionate, ethyl-propionate, 3-ethoxyethyl-propionate, methyl-lactate, ethyl-lactate, propyl-lactate, butyl-lactate, isobutyl-lactate, amyl-lactate, lactic acid isoamyl, 2-hydroxymethyl-isobutyrate, ethyl-2-hydroxyisobutyrate, methyl-benzoate, ethyl-benzoate, phenyl-acetate, benzyl-acetate, phenylmethyl-acetate, benzyl-formate, phenylethyl-formate, methyl 3-phenylpropionate, benzyl-propionate, ethylphenyl-acetate, and 2-phenylethyl-acetate. In this case, it is preferable that developing be performed by an alkaline developer so as to form the resist pattern on the photoresist film, and that the resist top coat on the photoresist film simultaneously be removed. By doing so, the resist top coat can be removed more conveniently without installing removal equipment in addition to the existing equipment.

When the developing is finished, the resist top coat is rinsed using a rinse liquid. The rinse liquid should be one that dissolves in and mixes with a developer and that does not dissolve the resist film. Examples of a preferable rinse liquid are C3-C10 alcohols, C8-C12 ether compounds, C6-C12 alkanes, alkynes, or aromatic compounds. The rinse treatment is not necessarily indispensable, and the developer may be spin dried without a rinse.

Examples of C6-C12 alkanes used for the rinse liquid are: hexane, heptane, octane, nonane, decane, undecane, dodecane, methylcyclopentane, dimethylcyclopentane, cyclohexane, methylcyclohexane, Dimethylcyclohexane, cycloheptane, cyclooctane, or cyclononane. Examples of C6-C12 alkenes used for the rinse liquid are: hexene, heptene, octene, cyclohexene, methyl-cyclohexene, dimethyl-cyclohexene, cycloheptene, and cyclooctene. Examples of C6-C12 alkynes used for the rinse liquid are: hexyne, heptyne, octyne and the like. Examples of C3-C10 alcohols used for the rinse liquid are n-propyl alcohol, isopropyl alcohol, 1-butyl alcohol, 2-butyl alcohol, isobutyl alcohol, tert-butyl alcohol, 1-Pentanol, 2-Pentanol, 3-Pentanol, tert-amyl-alcohol, neopentyl-alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-Ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Examples of C8-C12 ether compounds used for the rinse liquid are: di-n-butyl ether, diisobutyl ether, di-sec-butyl ether, di-n-pentyl ether, diisopentyl ether, di-sec-pentyl ether, di-tert-amyl ether, and di-n-hexyl ether. The rinse liquid may be used after being diluted with some suitable solvent, such as toluene, xylene, ethylbenzene, isopropylbenzene, t-butyl benzene, or mesitylene. Rinsing can reduce resist pattern defects such as the collapse of resist walls. However, rinsing is not necessarily indispensable. Skipping the rinse treatment can reduce the amount of the solvent used.

The resist top coat used for the patterning process according to this embodiment of the present invention may be used in a patterning process in which a positive-resist pattern is formed by using alkaline developing. It is possible to double the resolution by developing twice using an organic solvent and an alkaline solvent, respectively, to form both negative and positive patterns. In this process, the order in which the solvents are used is irrelevant.

In addition to the process steps mentioned above, various other process steps, such as etching, resist removal, washing, and so forth, can be performed.

EXAMPLES AND COMPARATIVE EXAMPLES

The present invention will be specifically explained hereinbelow by presenting examples and comparative examples, but the present invention is not limited to the following examples.

The polymers used for a resist top coat is shown below, with the polymers having a repeating unit p of styrene having a 1,1,1,3,3,3-hexafluoro-2-propanol group.

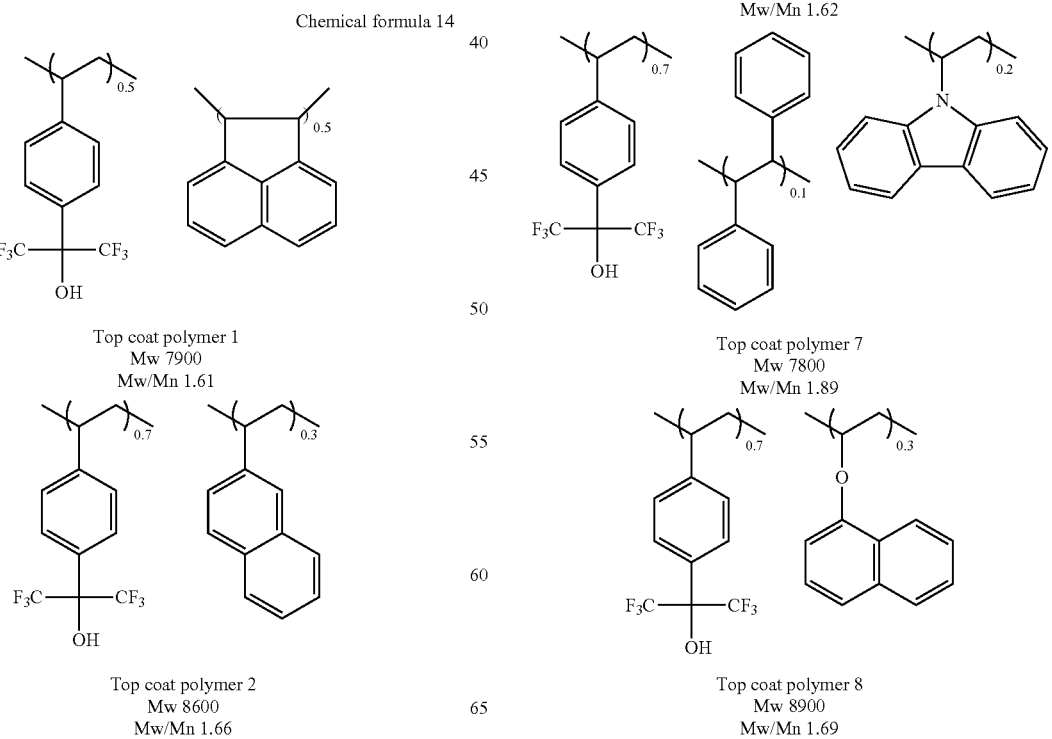

Chemical formula 15
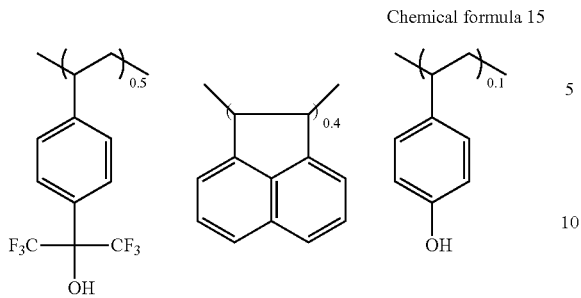
Top coat polymer 9
Mw 6100
MwMn 1.52
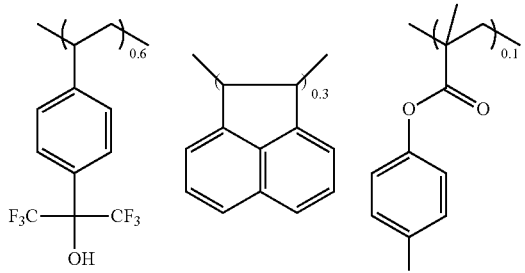
Top coat polymer 10
Mw 6800
MwMn 1.59
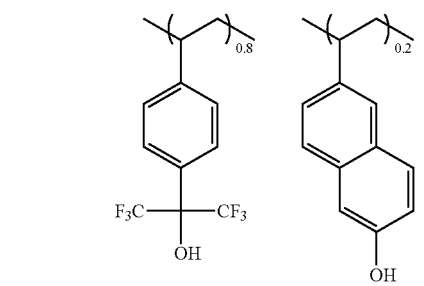
Top coat polymer 11
Mw 6300
MwMn 1.78
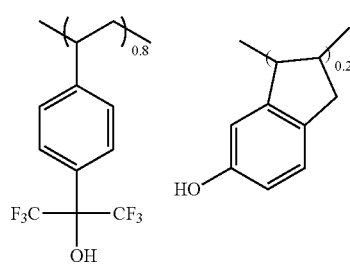
Top coat polymer 12
Mw 6000
Mw/Mn 1.68
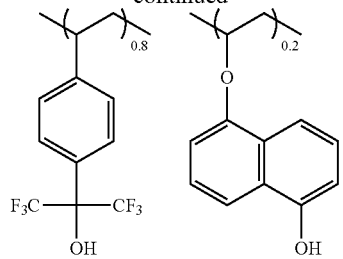
Top coat polymer 13
Mw 6300
MwMn 1.72
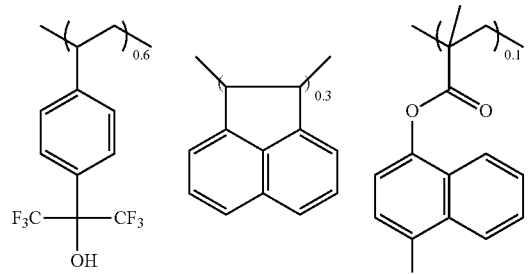
Top coat polymer 14
Mw 6800
MwMn 1.59
Chemical formula 16
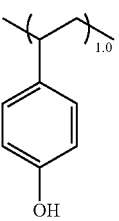
Comparative top coat polymer 1
Mw 8100
Mw/Mn 1.72
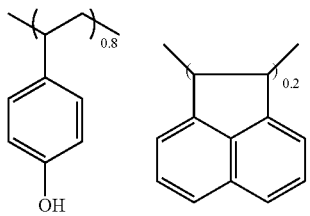
Comparative top coat polymer 2
Mw 6100
Mw/Mn 1.55
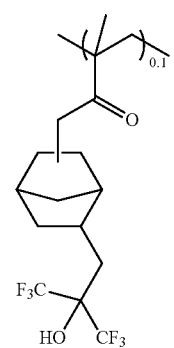
Cmoparative top coat polymer 3
Mw 9200
Mw/Mn 1.82

The resist top coat solutions of TC-1-TC-23 and Comparatives TC-1-TC-4 were prepared with the compositions listed in Tables 1 and 2, which compositions contain top coat polymers, additives, and solvents. In Comparative TC-4, the comparative resist top coat polymer-1 was not fully dissolved into the solvent of 100% diisopentyl ether.

TABLE 1

|  | Base Material (parts by mass) | Additives (parts by weight) | Solvent (parts by mass) |
|---|---|---|---|
| TC-1 | Top coat polymer 1 (10) |  | Diisopentyl ether (800) |
| TC-2 | Top coat polymer 2 (10) |  | Di-n-pentyl ether (800) |
| TC-3 | Top coat polymer 3 (10) |  | Diisopentyl ether (150) |
|  |  |  | n-Heptane (100) |
|  |  |  | Decane (500) |
| TC-4 | Top coat polymer 4 (10) |  | Dibutyl ether (200) |
|  |  |  | Mesitylene (600) |
|  |  |  | Methylcyclohexane (50) |
| TC-5 | Top coat polymer 5 (10) |  | Dihexyl ether (200) |
|  |  |  | t-butyl benzene (500) |
|  |  |  | 3-methyl hexane (100) |
| TC-6 | Top coat polymer 6 (10) |  | Diisopentyl ether (300) |
|  |  |  | Dicyclopentadiene (300) |
| TC-7 | Top coat polymer 7 (10) |  | Diisopentyl ether (300) |
|  |  |  | Tetrahydrodicyclopentadiene (200) |
|  |  |  | Octane (100) |
| TC-8 | Top coat polymer 8 (10) |  | Diisopentyl ether (300) |
|  |  |  | Tetrahydrodicyclopentadiene (200) |
|  |  |  | Octane (100) |
| TC-9 | Top coat polymer 9 (10) |  | Diisopentyl ether (800) |
| TC-10 | Top coat polymer 10 (10) |  | Diisopentyl ether (800) |
| TC-11 | Top coat polymer 11 (10) |  | Diisopentyl ether (800) |
| TC-12 | Top coat polymer 12 (10) |  | Diisopentyl ether (150) |
|  |  |  | Decane (550) |
| TC-13 | Top coat polymer 13 (10) |  | Diisopentyl ether (800) |
| TC-14 | Top coat polymer 14 (10) |  | Diisopentyl ether (800) |
| TC-15 | Top coat polymer 1 (10) |  | Diisopentyl ether (300) |
|  |  |  | 1,4-dimethyl cyclohexane (300) |
| TC-16 | Top coat polymer 1 (10) |  | Diisopentyl ether (300) |
|  |  |  | 3,4-Dimethyl-1-hexene (300) |
| TC-17 | Top coat polymer 1 (10) |  | Diisopentyl ether (200) |
|  |  |  | 2-Nonyne (400) |
| TC-18 | Top coat polymer 1 (10) | tri-n-octylamine (0.01) | Diisopentyl ether (200) |
|  |  |  | Iso-butyl cyclohexane (400) |
| TC-19 | Top coat polymer 1 (10) | 1-aminopyrene (0.01) | Diisopentyl ether (300) |
|  |  |  | Pinene (300) |
| TC-20 | Top coat polymer 1 (10) |  | Diisopentyl ether (300) |
|  |  |  | Terpinene (300) |
| TC-21 | Top coat polymer 1 (10) |  | Diisopentyl ether (300) |
|  |  |  | 2,2,4-trimethyl pentane (100) |
|  |  |  | Cyclo dodecane (200) |
| TC-22 | Top coat polymer 1 (10) |  | Diisopentyl ether (300) |
|  |  |  | Butylcyclohexane (300) |
| TC-23 | Top coat polymer 1 (10) |  | Diisopentyl ether (300) |
|  |  |  | Cyclo dodecane (300) |

TABLE 2

|  | Base Material (parts by mass) | Additives (parts by weight) | Solvent (parts by mass) |
|---|---|---|---|
| Comparative TC-1 | Comparative top coat polymer 1 (10) |  | 4-Methyl-2-pentanol (700) |
| Comparative TC-2 | Comparative top coat polymer 2 (10) |  | 4-Methyl-2-pentanol (400) |
|  |  |  | Diisopentyl ether (300) |
| Comparative TC-3 | Comparative top coat polymer 3 (10) |  | Diisopentyl ether (550) |
| Comparative TC-4 | Comparative top coat polymer 1 (10) |  | Diisopentyl ether (550) |

Each of the resist top coat solutions TC-1 to TC-23 and Comparatives TC-1 to TC-3 was applied on a silicon substrate by spin coating, and then baked at 100° C. for 60 seconds, so as to obtain each of the resist top coats having a film thickness of 20 nm (TC-1 to TC-23, and Comparatives TC-1 to TC-3). Then, the silicon substrate having the resist top coat formed thereon was developed by the foregoing method in an n-Butyl acetate solution for 30 seconds, and then the film thickness of the resist top coat after developing was measured. The results thereof are shown in the following Table 3. It was confirmed that, after developing, the resist top coat had been entirely dissolved.

TABLE 3

| Resist Top Coat | Film Thickness After Developing (nm) |
| --- | --- |
| TC-1 | 0 |
| TC-2 | 0 |
| TC-3 | 0 |
| TC-4 | 0 |
| TC-5 | 0 |
| TC-6 | 0 |
| TC-7 | 0 |
| TC-8 | 0 |
| TC-9 | 0 |
| TC-10 | 0 |
| TC-11 | 0 |
| TC-12 | 0 |
| TC-13 | 0 |
| TC-14 | 0 |
| TC-15 | 0 |
| TC-16 | 0 |
| TC-17 | 0 |
| TC-18 | 0 |
| TC-19 | 0 |
| TC-20 | 0 |
| TC-21 | 0 |
| TC-22 | 0 |
| TC-23 | 0 |

TABLE 3-continued

| Resist Top Coat | Film Thickness After Developing (nm) |
| --- | --- |
| Comparative TC-1 | 0 |
| Comparative TC-2 | 0 |
| Comparative TC-3 | 0 |

The rate of dissolution of the resist top coat of TC-1, which was formed on a silicon substrate and had a film thickness of 20 nm, and was soaked in an n-Butyl acetate solution, was measured using an RDA-800 made by Litho Tech Japan Corporation. The rate of dissolution was 67 nm/second.

Evaluation of EUV Exposure

The photoresist composition used to evaluate EUV exposure evaluation was the EUV resist SEVR-B1, manufactured by Shin-Etsu Chemical Co., Ltd. The resist composition was applied on a silicon wafer that had a diameter of 300 mm and that was pre-treated by baking at a temperature of 200° C., then vapor primed with hexamethyldisilazane (HDMS), and then baked at a temperature of 105° C. for 60 seconds to form a resist film having a film thickness of 60 nm. Then a resist top coat solution was applied on the resist film, which was then baked at a temperature of 100° C. for 60 seconds to obtain a resist top coat having a film thickness of 20 nm. The entire wafer thereof was exposed to a light that had been adjusted to an exposure amount such that one shot had a size of 26 mm×33 mm and the 34-nm line-and-space pattern was 1:1, by using an EUV scanner NXE 3100 (NA of 0.25 and δ of 0.8 with normal illumination) manufactured by ASML, and then baked (PEB) at a temperature of 95° C. for 60 seconds, followed by developing in an n-Butyl acetate solution for 30 seconds. The width of the line-and-space pattern was measured at 50 points within a shot by using a length-measuring SEM, and the difference between the maximum width and the minimum width within the shot of each Example and Comparative Example was calculated. In this case, the larger the effects of OOB light, the larger the difference between the maximum width and minimum width within a shot. The edge roughness (LWR) in the center of the shot for each of the examples and comparative examples was measured at the same time.

TABLE 4

| | Resist Name | Resist Top Coat | Sensitivity (mJ/cm$^2$) | LWR (nm) | Maximum Difference of Line Width within a Shot (nm) |
| --- | --- | --- | --- | --- | --- |
| Example 1 | SEVR-B1 | TC-1 | 20.3 | 5.28 | 1.79 |
| Example 2 | SEVR-B1 | TC-2 | 19.4 | 5.21 | 1.80 |
| Example 3 | SEVR-B1 | TC-3 | 24.4 | 5.21 | 1.71 |
| Example 4 | SEVR-B1 | TC-4 | 19.8 | 5.20 | 1.72 |
| Example 5 | SEVR-B1 | TC-5 | 23.6 | 5.28 | 1.80 |
| Example 6 | SEVR-B1 | TC-6 | 19.0 | 5.29 | 1.80 |
| Example 7 | SEVR-B1 | TC-7 | 19.6 | 5.21 | 1.81 |
| Example 8 | SEVR-B1 | TC-8 | 20.5 | 5.21 | 1.79 |
| Example 9 | SEVR-B1 | TC-9 | 20.2 | 5.28 | 1.80 |
| Example 10 | SEVR-B1 | TC-10 | 20.4 | 5.26 | 1.78 |
| Example 11 | SEVR-B1 | TC-11 | 19.8 | 5.11 | 1.73 |
| Example 12 | SEVR-B1 | TC-12 | 19.3 | 5.19 | 1.71 |
| Example 13 | SEVR-B1 | TC-13 | 19.3 | 5.21 | 1.76 |
| Example 14 | SEVR-B1 | TC-14 | 19.3 | 5.27 | 1.73 |
| Example 15 | SEVR-B1 | TC-15 | 19.3 | 5.26 | 1.78 |
| Example 16 | SEVR-B1 | TC-16 | 19.3 | 5.23 | 1.78 |

TABLE 4-continued

| | Resist Name | Resist Top Coat | Sensitivity (mJ/cm$^2$) | LWR (nm) | Maximum Difference of Line Width within a Shot (nm) |
|---|---|---|---|---|---|
| Example 17 | SEVR-B1 | TC-17 | 19.3 | 5.22 | 1.78 |
| Example 18 | SEVR-B1 | TC-18 | 22.3 | 5.10 | 1.76 |
| Example 19 | SEVR-B1 | TC-19 | 21.3 | 5.12 | 1.81 |
| Example 20 | SEVR-B1 | TC-20 | 19.3 | 5.16 | 1.79 |
| Example 21 | SEVR-B1 | TC-21 | 19.3 | 5.18 | 1.73 |
| Example 22 | SEVR-B1 | TC-22 | 19.3 | 5.21 | 1.75 |
| Example 23 | SEVR-B1 | TC-23 | 19.3 | 5.20 | 1.78 |
| Comparative Example 1 | SEVR-B1 | Comparative TC-1 | 18.5 | 5.65 | 1.89 |
| Comparative Example 2 | SEVR-B1 | Comparative TC-2 | 17.8 | 5.58 | 1.81 |
| Comparative Example 3 | SEVR-B1 | Comparative TC-3 | 24.5 | 5.30 | 2.17 |
| Comparative Example 4 | SEVR-B1 | | 19.0 | 5.42 | 1.94 |

Effects

The resist top coat of the present invention uses an amyl ether solvent that does little damage to the resist film, whereby the LWR is improved, and the difference between the maximum width and the minimum width within a shot can be made small. In order to dissolve the amyl ether solvent, a polymeric compound containing a repeating unit of styrene having a 1,1,1,3,3,3-hexafluoro-2-propanol group is required. The pattern obtained by the patterning process of the present invention has smaller edge roughness than that of Comparative TC-1 and TC-2. Comparative TC-3 does not have an aromatic group, with the result that its capability to block OOB light is low, and the difference between the maximum width and the minimum width within a shot becomes large.

Although the invention has been described in reference to the preferred embodiment, it should be understood that the invention is not to be limited to the disclosed embodiment. Rather, to the contrary, the invention is intended to cover various modifications without departing from its technical scope.

The invention claimed is:

1. A patterning process comprising:
    forming a resist top coat on a photoresist film on a substrate by using a resist top coat composition that contains a polymer having a repeating unit p of styrene having a 1,1,1,3,3,3-hexafluoro-2-propanol group shown in the following general formula (1), wherein m is 1 or 2, and p is 0<p≤1.0;
    exposing the formed resist top coat and the photoresist film to an electron beam or to extreme ultraviolet (EUV) light having a wavelength 3 nm to 15 nm; and
    developing the exposed photoresist film and the exposed resist top coat by using an organic-solvent-based developer to form a negative pattern; and
    wherein the step of developing the exposed photoresist film and the exposed resist top coat simultaneously removes the resist top coat:

Chemical formula 1

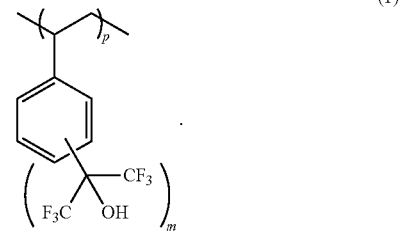

(1)

2. The patterning process according to claim 1, wherein the resist top coat composition contains a polymer in which the repeating unit p of styrene having a 1,1,1,3,3,3-hexafluoro-2-propanol group is copolymerized with one or more repeating units selected from the repeating units q1-q4 as shown in the following general formula (2), wherein R$^1$ is hydrogen, methyl; X$_1$ is a single bond, —C(=O)—O—, —O—, —N=; X$_2$ and X$_3$ are phenylene, naphthylene; X$_4$ is methylene, oxygen, sulfur; R$^2$ is C6-C20-allyl, C2-C6-alkenyl; R$^3$, R$^4$, R$^5$, and R$^6$ are independently hydrogen, hydroxyl, linear, branched, or cyclic C1-C10-alkyl, C2-C6-alkenyl, C6-C10-allyl, alkoxy, acyloxy, cyano, nitro, amino, halogen; the allyl may be substituted by hydroxyl, linear, branched, or cyclic C1-C10-alkyl, alkoxy, acyloxy, cyano, nitro, amino, halogen; v is 1 or 2; and 0<p<1.0, 0≤q<1.0, 0≤q2<1.0, 0≤q3<1.0, 0≤q4<1.0, and 0<q1+q2+q3+q4<1.0:

Chemical formula 2

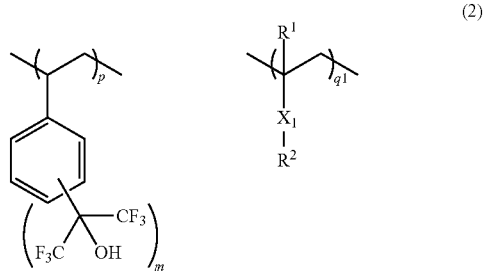

(2)

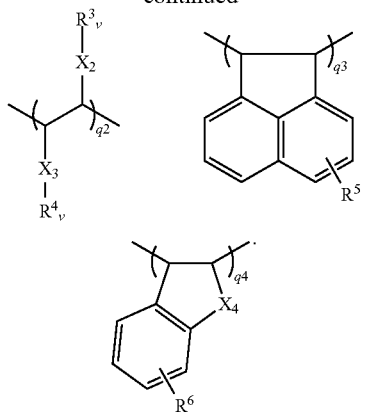

3. The patterning process according to claim 1, wherein the organic-solvent-based developer is selected from the group consisting of 2-octanone, 2-nonanone, 2-heptanone, 3-heptanone, 4-heptanone, 2-hexanone, 3-hexanone, diisobutyl-ketone, methylcyclohexanone, acetophenone, methylacctophenone, propyl-acetate, butyl-acetate, isobutyl-acetate, amyl-acetate, butenyl-acetate, isoamyl-acetate, phenyl-acetate, propyl-formate, butyl-formate, isobutyl-formate, amyl-formate, isoamyl-formate, methyl-valerate, methyl-pentenate, methyl-crotonate, ethyl-crotonate, methyl-propionate, ethyl-propionate, 3-ethoxyethyl-propionate, methyl-lactate, ethyl-lactate, propyl-lactate, butyl-lactate, isobutyl-lactate, amyl-lactate, isoamyl-lactate, 2-hydroxymethyl-isobutyrate, ethyl-2-hydroxy-isobutyrate, methyl-benzoate, ethyl-benzoate, phenyl-acetate, benzyl-acetate, phenylmethyl-acetate, benzyl-formate, phenylethyl-formate, methyl-3-phenylpropionate, benzyl-propionate, ethyl-phenyl-acetate, 2-phenylethyl-acetate, and mixtures thereof.

4. The patterning process according to claim 1, wherein the resist top coat composition used in the patterning process contains the polymer dissolved in an ether solvent, and wherein the ether solvent is selected from the group consisting of diisopropyl ether, diisobutyl ether, diisopentyl ether, di-n-pentyl-ether, methylcyclopentyl-ether, methylcyclohexyl ether, di-n-butyl ether, di-sec-butyl ether, diisopentyl-ether, di-sec-pentyl ether, di-tert-amyl ether, di-n-hexyl ether, and mixtures thereof.

5. The patterning process according to claim 4, wherein the polymer is dissolved in a C7-C12 hydrocarbon-based solvent in addition to the ether solvent.

6. The patterning process according to claim 5, wherein the C7-C12 hydrocarbon-based solvent has a boiling point of in the range of 85° C.-250° C. at 1 atm.

7. The patterning process according to claim 5, wherein the C7-C12 hydrocarbon based solvent is selected from the group consisting of n-heptane, isoheptane, 3-methyl hexane, 2,3-dimethyl-pentane, 3-ethyl-pentane, 1,6-heptadiene, 5-methyl-1-hexyne, norbornane, norbornene, dicyclopentadiene, 1-methyl-1,4-cyclohexadiene, 1-heptyne, 2-heptyne, cycloheptane, cycloheptene, 1,3-dimethyl-cyclopentane, ethylcyclopentane, methylcyclohexane, 1-methyl-1-cyclohexene, 3-methyl-1-cyclohexene, methylenecyclohexane, 4-methyl-1-cyclohexene, 2-methyl-1-hexene, 2-methyl-2-hexene, 1-Heptene, 2-Heptene, 3-Heptene, n-octane, 2,2-dimethyl-hexane, 2,3-dimethyl-hexane, 2,4-dimethyl-hexane, 2,5-dimethyl-hexane, 3,3-dimethyl-hexane, 3,4-dimethyl-hexane, 3-ethyl-2-methyl-pentane, 3-ethyl-3-methyl-pentane, 2-methyl-heptane, 3-methyl-heptane, 4-methyl-heptane, 2,2,3-trimethyl-pentane, 2,2,4-trimethyl-pentane, cyclooctane, cyclooctene, 1,2-dimethyl-cyclohexane, 1,3-dimethyl-cyclohexane, 1,4-dimethyl-cyclohexane, ethyl-cyclohexane, vinyl-cyclohexane, isopropyl-cyclopentane, 2,2-dimethyl-3-hexene, 2,4-dimethyl-1-hexene, 2,5-dimethyl-1-hexene, 2,5-dimethyl-2-hexene, 3,3-dimethyl-1-hexene, 3,4-dimethyl-1-hexene, 4,4-dimethyl-1-hexene, 2-Ethyl-1-hexene, 2-methyl-1-heptene, 1-octene, 2-octene, 3-octene, 4-octene, 1,7-octadiene, 1-octyne, 2-octyne, 3-octyne, 4-octyne, n-nonane, 2,3-dimethyl-heptane, 2,4-dimethyl-heptane, 2,5-dimethyl-heptane, 3,3-dimethyl-heptane, 3,4-dimethyl-heptane, 3,5-dimethyl-heptane, 4-ethyl-heptane, 2-methyl-octane, 3-methyl-octane, 4-methyl-octane, 2,2,4,4-tetramethyl-pentane, 2,2,4-trimethyl-hexane, 2,2,5-trimethyl-hexane, 2,2-dimethyl-3-heptene, 2,3-dimethyl-3-heptene, 2,4-dimethyl-1-heptene, 2,6-dimethyl-1-heptene, 2,6-dimethyl-3-heptene, 3,5-dimethyl-3-heptene, 2,4,4-Trimethyl-1-hexene, 3,5,5-Trimethyl-1-hexene, 1-ethyl-2-methyl-cyclohexane, 1-ethyl-3-methyl-cyclohexane, 1-ethyl-4-methyl-cyclohexane, propyl-cyclohexane, isopropyl-cyclohexane, 1,1,3-trimethyl-cyclohexane, 1,1,4-trimethyl-cyclohexane, 1,2,3-trimethyl-cyclohexane, 1,2,4-trimethyl-cyclohexane, 1,3,5-trimethyl-cyclohexane, allyl-cyclohexane, hydrindane, 1,8-nonadiene, 1-nonyne, 2-nonyne, 3-nonyne, 4-nonyne, 1-nonene, 2-nonene, 3-nonene, 4-nonene, n-decane, 3,3-dimethyl-octane, 3,5-dimethyl-octane, 4,4-dimethyl-octane, 3-ethyl-3-methyl-heptane, 2-Methyl-nonane, 3-methyl-nonane, 4-methyl-nonane, tert-butyl-cyclohexane, butylcyclohexane, iso-butyl-cyclohexane, 4-isopropyl-1-methyl-cyclohexane, pentylcyclopentane, 1,1,3,5-tetramethyl cyclohexane, cyclododecane, 1-decene, 2-decene, 3-decene, 4-decene, 5-decene, 1,9-decadiene, decahydro-naphthalene, 1-decyne, 2-decyne, 3-decyne, 4-decyne, 5-decyne, 1,5,9-decatriene, 2,6-dimethyl-2,4,6-octatriene, limonene, myrcene, 1,2,3,4,5-Pentamethylcyclopentadiene, α-phellandrene, pinene, terpinene, tetrahydrodicyclopentadiene, 5,6-dihydro-cyclopentadiene, dicyclopentadiene, 1,4-decadiyne, 1,5-decadiyne, 1,9-decadiyne, 2,8-decadiyne, 4,6-decadiyne, n-undecane, amyl cyclohexane, 1-undecene, 1,10-undecadien, 1-undecyne, 3-undecyne, 5-undecyne, Tricyclo[6.2.1.0$^{2,7}$]undec-4-ene, n-dodecane, 2-methyl-undecane, 3-methyl-undecane, 4-methyl-undecane, 5-methyl-undecane, 2,2,4,6,6-penta-methyl-heptane, 1,3-dimethyl-adamantane, 1-ethyl-adamantane, 1,5,9-cyclododecatriene, toluene, xylene, cumene, 1,2,3-trimethyl-benzene, 1,2,4-trimethyl-benzene, 1,3,5-trimethyl-benzene, styrene, a-methyl styrene, butyl-benzene, sec-butyl-benzene, isobutyl-benzene, cymene, diethyl-benzene, 2-ethyl-p-xylene, 2-propyl toluene, 3-propyl-toluene, 4-propyl-toluene, 1,2,3,5-tetramethyl toluene, 1,2,4,5-tetramethyl toluene, tetrahydronaphthalene, 4-Phenyl-1-butene, tert-amyl benzene, amyl benzene, 2-tert-butyl-toluene, 3-tert-butyl-toluene, 4-tert-butyl-toluene, 5-isopropyl-m-xylene, neopentyl benzene, 3-methyl-ethylbenzene, tert-butyl-3-ethylbenzene, 4-tert-butyl-o-xylene, 5-tert-Butyl-m-xylene, tert-butyl-p-xylene, 1,2-diisopropyl-benzene, 1,3-diisopropyl-benzene, 1,4-diisopropyl-benzene, di-propyl-benzene, 3,9-dodecadiyne, pentamethylbenzene, hexamnethylbenzcne, hexyl-benzene, 1,3,5-triethyl-benzene, 1,2,4-trivinyl-cyclohexane, and mixtures thereof.

* * * * *